(12) United States Patent
Sung et al.

(10) Patent No.: US 12,527,051 B2
(45) Date of Patent: Jan. 13, 2026

(54) SEMICONDUCTOR DEVICES AND METHODS FOR MANUFACTURING THE SAME

(71) Applicant: Samsung Electronics Co., Ltd., Suwon-si (KR)

(72) Inventors: Sug Hyun Sung, Yongin-si (KR); Jung Gun You, Ansan-si (KR); Mi Ri Joung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 508 days.

(21) Appl. No.: 17/938,642

(22) Filed: Oct. 6, 2022

(65) Prior Publication Data
US 2023/0207627 A1 Jun. 29, 2023

(30) Foreign Application Priority Data

Dec. 24, 2021 (KR) .......................... 10-2021-0187340
Feb. 15, 2022 (KR) .......................... 10-2022-0019268

(51) Int. Cl.
*H10D 62/13* (2025.01)
*H10D 30/01* (2025.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC ............... H10D 62/151; H10D 62/121; H10D 62/364; H10D 62/822; H10D 62/116;
(Continued)

(56) References Cited

U.S. PATENT DOCUMENTS 9,881,993 B2    1/2018  Ching et al.
10,431,651 B1 * 10/2019  Chao .................. H10D 30/6757
(Continued)

FOREIGN PATENT DOCUMENTS

KR    10-2020-0132436 A    11/2020
KR    10-2020-0136230 A    12/2020

*Primary Examiner* — Dao H Nguyen
(74) *Attorney, Agent, or Firm* — Wolf, Greenfield & Sacks, P.C.

(57) ABSTRACT

There is provided a semiconductor device capable of improving the performance and reliability of a device. The semiconductor device comprising an active pattern including, a lower pattern extending in a first direction, and a plurality of sheet patterns spaced apart from the lower pattern in a second direction perpendicular to the first direction, wherein the lower pattern includes a semiconductor material, a plurality of gate structures on the lower pattern and spaced apart from each other in the first direction, wherein each of the plurality of gate structures includes a gate electrode and a gate insulating film, a source/drain recess between adjacent ones of the gate structures, wherein a bottom of the source/drain recess is in the lower pattern, a bottom insulating liner in the bottom of the source/drain recess, and a source/drain pattern in the source/drain recess and on top of the bottom insulating liner.

11 Claims, 24 Drawing Sheets

(51) Int. Cl.
  *H10D 30/43* (2025.01)
  *H10D 30/67* (2025.01)
  *H10D 62/10* (2025.01)
  *H10D 64/01* (2025.01)
  *H10D 64/23* (2025.01)
  *H10D 64/27* (2025.01)
  *H10D 84/01* (2025.01)
  *H10D 84/03* (2025.01)
  *H10D 84/85* (2025.01)

(52) U.S. Cl.
  CPC ..... *H10D 30/6729* (2025.01); *H10D 30/6735* (2025.01); *H10D 30/6757* (2025.01); *H10D 62/121* (2025.01); *H10D 64/01* (2025.01); *H10D 64/017* (2025.01); *H10D 64/018* (2025.01); *H10D 64/021* (2025.01); *H10D 64/258* (2025.01); *H10D 64/516* (2025.01); *H10D 84/0167* (2025.01); *H10D 84/017* (2025.01); *H10D 84/0181* (2025.01); *H10D 84/0184* (2025.01); *H10D 84/038* (2025.01); *H10D 84/85* (2025.01)

(58) Field of Classification Search
  CPC ................ H10D 30/014; H10D 30/43; H10D 30/6729; H10D 30/6735; H10D 30/62; H10D 64/01; H10D 64/017; H10D 64/018; H10D 64/021; H10D 64/258; H10D 64/516; H10D 64/256; H10D 84/0167; H10D 84/017; H10D 84/0181; H10D 84/0184; H10D 84/038; H10D 84/85; H10D 84/0133
  See application file for complete search history.

(56) References Cited

U.S. PATENT DOCUMENTS

| | | | | |
|---|---|---|---|---|
| 10,734,523 | B2 * | 8/2020 | Lie | H10D 30/6713 |
| 10,923,598 | B2 | 2/2021 | Wang et al. | |
| 11,145,765 | B2 | 10/2021 | Chung et al. | |
| 11,295,983 | B2 * | 4/2022 | Xie | H10D 62/116 |
| 2021/0126135 | A1 * | 4/2021 | Lee | H10D 30/014 |
| 2021/0135008 | A1 | 5/2021 | Chiang et al. | |
| 2021/0202742 | A1 | 7/2021 | Huang et al. | |
| 2021/0343578 | A1 | 11/2021 | Chang et al. | |
| 2022/0122893 | A1 * | 4/2022 | Lai | H10D 62/116 |
| 2022/0310452 | A1 * | 9/2022 | Wu | H10D 84/83 |
| 2022/0310806 | A1 * | 9/2022 | Yang | H10D 62/121 |
| 2022/0367622 | A1 * | 11/2022 | Lin | H10D 30/6713 |

* cited by examiner

SEMICONDUCTOR DEVICES AND METHODS FOR MANUFACTURING THE SAME

CROSS-REFERENCE TO RELATED APPLICATION

This application claims priority from Korean Patent Application Nos. 10-2021-0187340 filed on Dec. 24, 2021, and 10-2022-0019268 filed on Feb. 15, 2022, in the Korean Intellectual Property Office, and all the benefits accruing therefrom under 35 U.S.C. 119, the contents of which in their entireties are herein incorporated by reference.

BACKGROUND

The present disclosure relates to semiconductor devices and methods for manufacturing the same. One of various scaling schemes for increasing a density of a semiconductor device includes a multi-gate transistor in which a multi-channel active pattern (or silicon body) in a shape of a fin or a nanowire is formed on a substrate and a gate is formed on a surface of the multi-channel active pattern.

Because the multi-gate transistor uses a three-dimensional channel, it may be easy to scale the multi-gate transistor. Further, current control ability of the multi-gate transistor may be improved without increasing a gate length of the multi-gate transistor. In addition, the multi-gate transistor may effectively suppress an SCE (short channel effect) in which a potential of a channel area is affected by a drain voltage.

SUMMARY

A purpose of the present disclosure is to provide a semiconductor device capable of improving element performance and reliability.

Another purpose of the present disclosure is to provide a method for manufacturing a semiconductor device capable of improving element performance and reliability.

Purposes according to the present disclosure are not limited to the above-mentioned purposes. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to an aspect of the present disclosure, there is provided a semiconductor device comprising, an active pattern including, a lower pattern extending in a first direction, and a plurality of sheet patterns spaced apart from the lower pattern in a second direction perpendicular to the first direction, wherein the lower pattern includes a semiconductor material, a plurality of gate structures on the lower pattern and spaced apart from each other in the first direction, wherein each of the plurality of gate structures includes a gate electrode and a gate insulating film, a source/drain recess between adjacent ones of the gate structures, wherein a bottom of the source/drain recess is in the lower pattern, a bottom insulating liner in the bottom of the source/drain recess, and a source/drain pattern in the source/drain recess and on top of the bottom insulating liner, wherein a vertical distance between a topmost portion of the bottom insulating liner and a bottommost portion of the bottom of the source/drain recess is equal to or smaller than a vertical distance between an upper surface of the lower pattern and the bottommost portion of the bottom of the source/drain recess.

According to another aspect of the present disclosure, there is provided a semiconductor device comprising, an active pattern including, a lower pattern extending in a first direction, and a plurality of sheet patterns spaced apart from the lower pattern in a second direction perpendicular to the first direction, a plurality of gate structures on the lower pattern and spaced apart from each other in the first direction, wherein each of the plurality of gate structures includes a gate electrode and a gate insulating film, a source/drain recess between adjacent ones of the gate structures, wherein a bottom of the source/drain recess is in the lower pattern, a bottom insulating liner in the bottom of the source/drain recess, and a source/drain pattern in the source/drain recess and on top of the bottom insulating liner, wherein a vertical distance between a topmost portion of the bottom insulating liner and a bottommost portion of the bottom of the source/drain recess is equal to or smaller than a vertical distance between an upper surface of the lower pattern and the bottommost portion of the bottom of the source/drain recess, wherein the bottom insulating liner is not overlapped by any of the sheet patterns in the second direction.

According to still another aspect of the present disclosure, there is provided a semiconductor device comprising a first active pattern including, a first lower pattern extending in a first direction, and a plurality of first sheet patterns spaced apart from the first lower pattern in a second direction perpendicular to the first direction, a second active pattern including, a second lower pattern extending in the first direction, and a plurality of second sheet patterns spaced apart from the second lower pattern in the second direction, a plurality of first gate structures on the first lower pattern and spaced apart from each other in the first direction, wherein each of a plurality of the first gate structures includes a first gate electrode and a first gate insulating film, a plurality of second gate structures on the second lower pattern and spaced apart from each other in the first direction, wherein each of a plurality of the second gate structures includes a second gate electrode and a second gate insulating film, a first source/drain recess between adjacent ones of the first gate structures, wherein a bottom of the first source/drain recess is the first lower pattern.

According to still another aspect of the present disclosure, there is provided a method for manufacturing a semiconductor device, the method comprising forming a lower pattern and an upper pattern structure on a substrate, wherein the upper pattern structure includes a plurality of sacrificial patterns and a plurality of active patterns alternately stacked with each other, forming a dummy gate structure on the upper pattern structure, forming a source/drain recess in the upper pattern structure using the dummy gate structure as a mask, wherein a bottom of the source/drain recess is in the lower pattern, forming a pre-insulating liner along a side and the bottom of the source/drain recess, removing a portion of the pre-insulating liner, thereby forming a bottom insulating liner in the bottom of the source/drain recess, forming a source/drain pattern on the bottom insulating liner such that the source/drain pattern is in the source/drain recess and is electrically connected to the active patterns, and after forming the source/drain pattern, removing the sacrificial patterns to provide the active patterns as sheet patterns electrically connected to the source/drain pattern.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION

Figure 1:
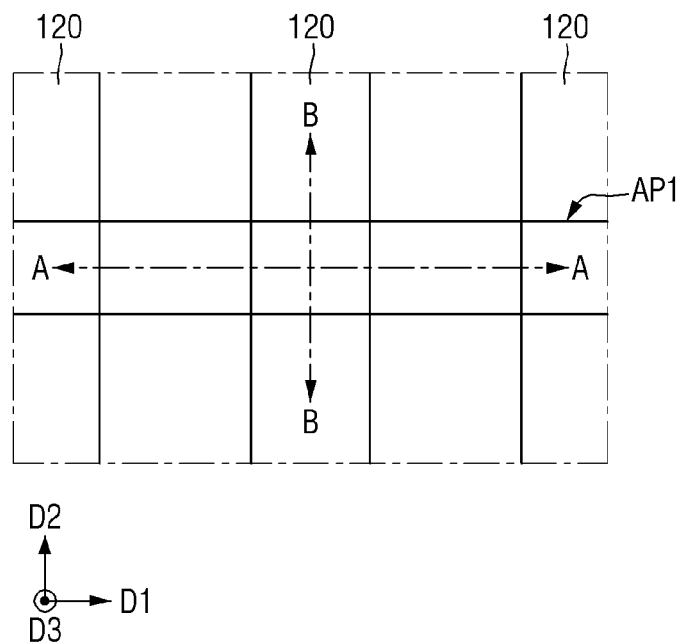
FIG. 1 is an illustrative layout diagram for illustrating a semiconductor device according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements may be omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the scope of the present disclosure as defined by the appended claims.

A shape, a size, a ratio, an angle, a number, etc. disclosed in the drawings for illustrating embodiments of the present disclosure are each illustrative, and the present disclosure is not limited thereto.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction D1", "second direction D2" and "third direction D3" should not be interpreted only to have a geometric relationship in which the first direction, the second direction, and the third direction are perpendicular to each other. The "first direction D1", "second direction D2" and "third direction D3" may be interpreted to have a broader direction within a range in which components herein may work functionally.

Hereinafter, embodiments of the present disclosure will be described with reference to the drawings.

The semiconductor device according to some embodiments may include a tunneling transistor (tunneling field effect transistor (FET)), a 3D transistor, or a 2D material-based FET based on a two-dimensional material, and a heterostructure thereof. Further, the semiconductor device according to some embodiments may include a bipolar junction transistor, a lateral double diffusion transistor (LD-MOS), and the like. In some embodiments, the semiconductor device may include a Multi-Bridge Channel Field Effect Transistor (MBCFET™).

With reference to FIG. 1 to FIG. 4, a description will be made of a semiconductor device according to some embodiments.

Figure 2:
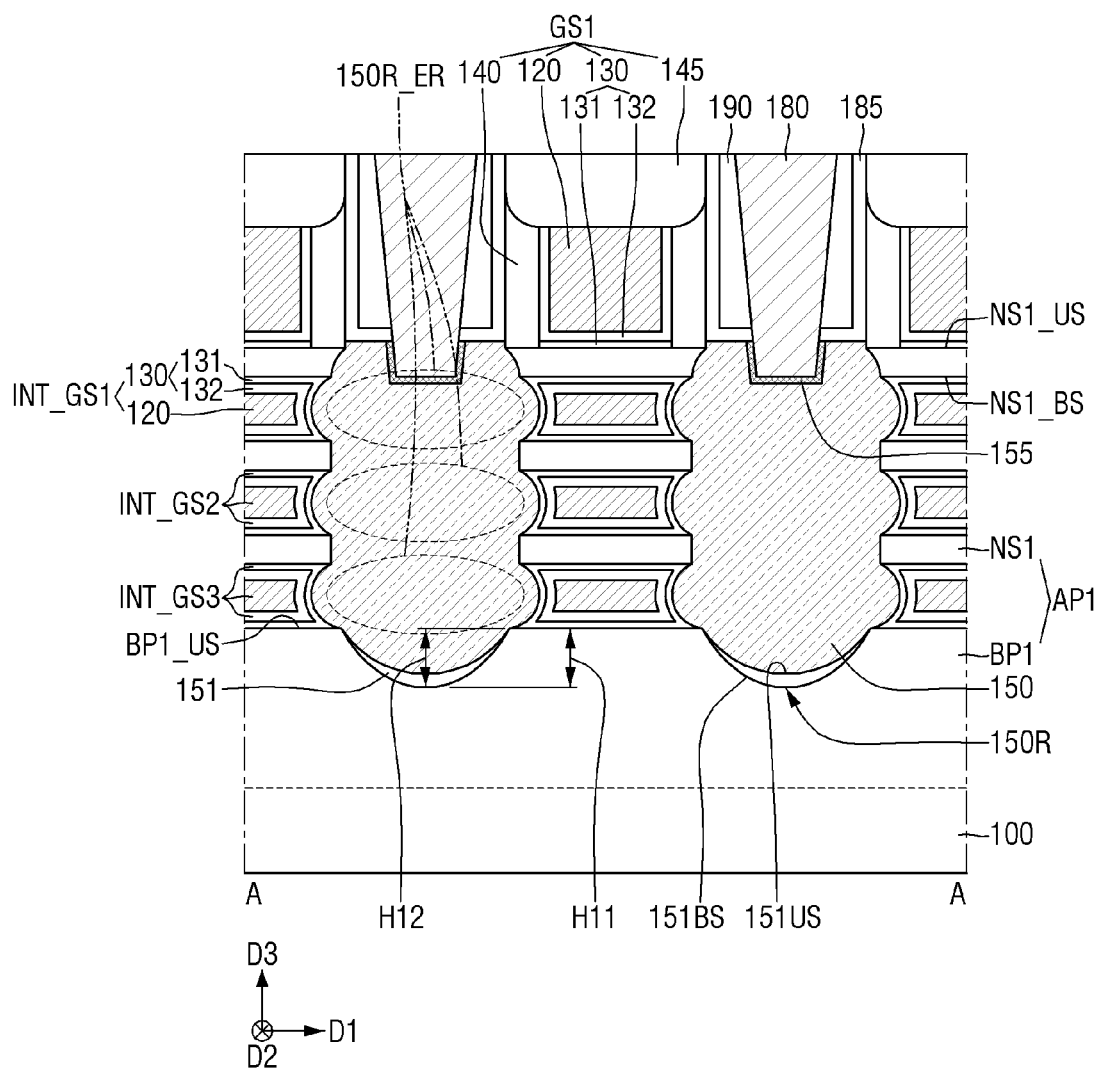
FIG. 2 is an illustrative cross-sectional view taken along line A-A of FIG. 1.
Figure 3:
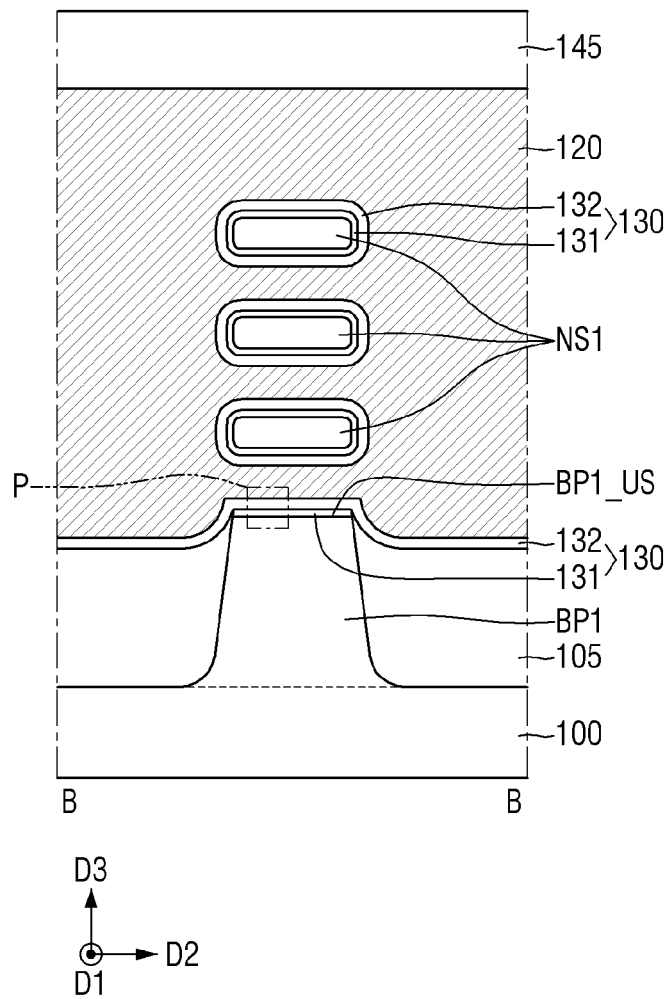
FIG. 3 is an illustrative cross-sectional view taken along line B-B of FIG. 1.
Figure 4:
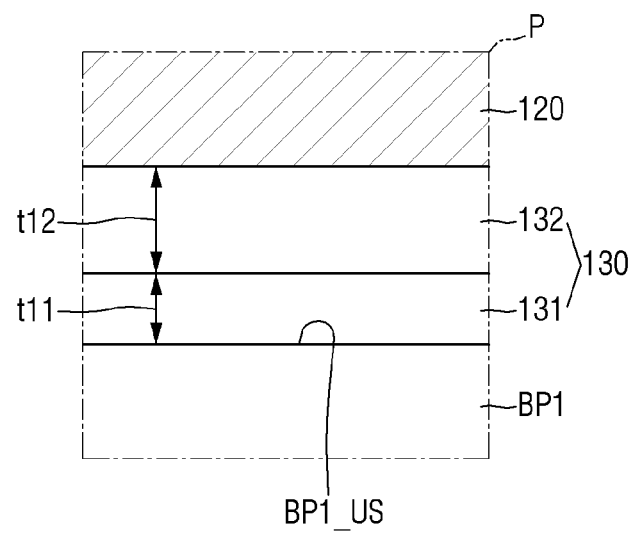
FIG. 4 is an enlarged view of a portion P of FIG. 3.

FIG. 1 is an illustrative layout diagram for illustrating a semiconductor device according to some embodiments. FIG. 2 is an illustrative cross-sectional view taken along line A-A of FIG. 1. FIG. 3 is an illustrative cross-sectional view taken along line B-B of FIG. 1. FIG. 4 is an enlarged view of a portion P of FIG. 3.

Referring to FIG. 1 to FIG. 4, the semiconductor device according to some embodiments may include a first active pattern AP1, a plurality of first gate electrodes 120, a first source/drain pattern 150, and a bottom insulating liner 151.

A substrate 100 may be made of bulk silicon or SOI (silicon-on-insulator). Alternatively, the substrate 100 may be implemented as a silicon substrate, or may be made of a material other than silicon, such as silicon germanium, SGOI (silicon germanium on insulator), indium antimonide, lead telluride, indium arsenide, indium phosphide, gallium arsenide or gallium antimonide, but may not be limited thereto.

The first active pattern AP1 may be disposed on the substrate 100. The first active pattern AP1 may extend in an elongate manner in the first direction D1.

In one example, the first active pattern AP1 may be disposed in an area where a NMOS device is formed. In another example, the first active pattern AP1 may be disposed in an area where a PMOS device is formed. In following description, an example in which the first active pattern AP1 is disposed in an area where the NMOS device is formed is described. In another example, contents described below may be applied to an example in which the first active pattern AP1 is disposed in an area where the PMOS device is formed.

The first active pattern AP1 may be, for example, a multi-channel active pattern. The first active pattern AP1 may include a first lower pattern BP1 and a plurality of first sheet patterns NS1.

The first lower pattern BP1 may protrude from the substrate 100. The first lower pattern BP1 may extend in the first direction D1.

The plurality of first sheet (e.g., nanosheet) patterns NS1 may be disposed on an upper surface BP1_US of the first lower pattern BP1. The plurality of first sheet patterns NS1 may be spaced apart from the first lower pattern BP1 in the third direction D3. The first sheet patterns NS1 may be spaced apart from each other in the third direction D3.

Each of the first sheet patterns NS1 may include an upper surface NS1_US and a bottom surface NS1_BS. The upper surface NS1_US of the first sheet pattern NS1 is opposite to the bottom surface NS1_BS of the first sheet pattern NS1 in the third direction D3. The third direction D3 may be a direction intersecting the first direction D1 and the second direction D2. For example, the third direction D3 may be a thickness direction of the substrate 100. The first direction D1 may be a direction intersecting the second direction D2.

Although it is illustrated three first sheet patterns NS1 are arranged in the third direction D3, this is only for convenience of illustration. However, the present disclosure is not limited thereto.

The first lower pattern BP1 may be formed by etching a portion of the substrate 100, or may include an epitaxial layer grown from the substrate 100. The first lower pattern BP1 may include silicon or germanium as an elemental semiconductor material. Further, the first lower pattern BP1 may include a compound semiconductor, for example, a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto.

The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V element with each other, or a quaternary compound obtained by combining three of aluminum (Al), gallium (Ga), and indium (In) as a group III element and one of phosphorus (P), arsenic (As), and antimony (Sb) as a group V element with each other.

For example, the first lower pattern BP1 may be made of a semiconductor material. The upper surface BP1_US of the first lower pattern may be made of a semiconductor material.

The first sheet pattern NS1 may include one of silicon or germanium as an elemental semiconductor material, a group IV-IV compound semiconductor, or a group III-V compound semiconductor. Each of the first sheet patterns NS1 may include the same material as that of the first lower pattern BP1, or may include a material other than that of the first lower pattern BP1.

In the semiconductor device according to some embodiments, the first lower pattern BP1 may be a silicon lower pattern including silicon, while the first sheet pattern NS1 may be a silicon sheet pattern including silicon (e.g., a silicon nanosheet).

A dimension of the first sheet pattern NS1 in the second direction D2 may be increased or decreased in proportion to a dimension of the first lower pattern BP1 in the second direction D2. In one example, dimensions in the second direction D2 of the first sheet patterns NS1 arranged in the third direction D3 are shown to be equal to each other. However, this is only for convenience of illustration and the present disclosure is not limited thereto. Unlike the illustration, as vertical levels of the first sheet patterns NS1 based on the first lower pattern BP1 increase, the dimensions in the second direction D2 of the first sheet patterns NS1 stacked in the third direction D3 may decrease. That is, the dimension in the second direction D2 of the topmost first sheet patterns NS1 may be the smallest.

A field insulating film 105 may be formed on the substrate 100. The field insulating film 105 may be disposed on a sidewall of the first lower pattern BP1. The field insulating film 105 is not disposed on the upper surface BP1_US of the first lower pattern.

In one example, the field insulating film 105 may cover an entirety of a sidewall of the first lower pattern BP1. Unlike what is shown, the field insulating film 105 may cover only a first portion (e.g., a lower portion) of a sidewall of the first lower pattern BP1. In this case, a second portion (e.g., an upper portion of the sidewall) of the first lower pattern BP1 may protrude in the third direction D3 upwardly beyond an upper surface of the field insulating film 105.

A vertical level of each of the first sheet patterns NS1 is higher than that of the upper surface of the field insulating film 105. The field insulating film 105 may include, for example, an oxide film, a nitride film, an oxynitride film, or a combination thereof. Although the field insulating film 105 is shown as a single film, this is only for convenience of illustration and the present disclosure is not limited thereto.

A plurality of first gate structures GS1 may be disposed on the substrate 100. Each of the first gate structures GS1 may extend in the second direction D2. The first gate structures GS1 may be disposed to be spaced apart from each other in the first direction D1. The first gate structures GS1 may be adjacent to each other in the first direction D1. For example, the first gate structures GS1 may be disposed on each of both opposing sides of a first source/drain pattern 150 in the first direction D1.

The first gate structure GS1 may be disposed on the first active pattern AP1. The first gate structure GS1 may intersect the first active pattern AP1.

The first gate structure GS1 may intersect the first lower pattern BP1. The first gate structure GS1 may surround each of the first sheet patterns NS1.

The first gate structure GS1 may include, for example, a first gate electrode 120, a first gate insulating film 130, a first gate spacer 140, and a first gate capping pattern 145.

The first gate structure GS1 may include a plurality of inner gate structures INT_GS1, INT_GS2, and INT_GS3 disposed between the first sheet patterns NS1 adjacent to each other in the third direction D3 and between the first lower pattern BP1 and the first sheet pattern NS1. The inner gate structures INT_GS1, INT_GS2, and INT_GS3 may be disposed between the upper surface BP1_US of the first lower pattern BP1 and a bottom surface NS1_BS of the lowest first sheet pattern NS1, and an upper surface NS1_US of any first sheet pattern NS1 and a bottom surface NS1_BS of another first sheet pattern NS1 adjacent thereto in the third direction D3.

The number of the inner gate structures INT_GS1, INT_GS2, and INT_GS3 may be proportional to the number of the first sheet patterns NS1 included in the active pattern AP1. For example, the number of the inner gate structures INT_GS1, INT_GS2, and INT_GS3 may be equal to the number of the first sheet patterns NS1. Since the first active pattern AP1 includes the plurality of first sheet patterns NS1, the first gate structure GS1 may include the plurality of inner gate structures INT_GS1, INT_GS2, and INT_GS3.

The inner gate structures INT_GS1, INT_GS2, and INT_GS3 may contact the upper surface BP1_US of the first lower pattern BP1, the upper surface NS1_US of the first sheet pattern NS1, and the bottom surface NS1_BS of the first sheet pattern NS1.

The inner gate structures INT_GS1, INT_GS2, and INT_GS3 may contact the first source/drain pattern 150. For example, the inner gate structures INT_GS1, INT_GS2, and INT_GS3 may directly contact the first source/drain pattern 150.

Following description is made based on a case where the number of inner gate structures INT_GS1, INT_GS2, and INT_GS3 is 3.

The first gate structure GS1 may include a first inner gate structure INT_GS1, a second inner gate structure INT_GS2, and a third inner gate structure INT_GS3. The first inner gate structure INT_GS1, the second inner gate structure INT_GS2, and the third inner gate structure INT_GS3 may be sequentially and vertically stacked on the first lower pattern BP1.

The third inner gate structure INT_GS3 may be disposed between the first lower pattern BP1 and the lowest first sheet pattern NS1. The third inner gate structure INT_GS3 may constitute the bottommost one of the inner gate structures INT_GS1, INT_GS2, and INT_GS3. The third inner gate structure INT_GS3 may contact the upper surface BP1_US of the first lower pattern BP1.

Each of the first inner gate structure INT_GS1 and the second inner gate structure INT_GS2 may be disposed between the first sheet patterns NS1 adjacent to each other in the third direction D3. The first inner gate structure INT_GS1 may constitute the topmost one of the inner gate structures INT_GS1, INT_GS2, and INT_GS3. The first inner gate structure INT_GS1 may contact the bottom surface NS1_BS of the topmost first sheet pattern NS1. The second inner gate structure INT_GS2 is disposed between the first inner gate structure INT_GS1 and the third inner gate structure INT_GS3.

The inner gate structures INT_GS1, INT_GS2, and INT_GS3 include the first gate electrode 120 and the first gate insulating film 130 disposed between adjacent first sheet patterns NS1 and between the first lower pattern BP1 and the bottommost first sheet pattern NS1.

In one example, a dimension of the first inner gate structure INT_GS1 in the first direction D1 may be equal to a dimension of the second inner gate structure INT_GS2 in the first direction D1. A dimension of the third inner gate structure INT_GS3 in the first direction D1 may be equal to a dimension of the second inner gate structure INT_GS2 in the first direction D1.

In another example, a dimension of the third inner gate structure INT_GS3 in the first direction D1 may be greater than a dimension of the second inner gate structure INT_GS2 in the first direction D1. A dimension of the first inner gate structure INT_GS1 in the first direction D1 may be equal to a dimension of the second inner gate structure INT_GS2 in the first direction D1.

The second inner gate structure INT_GS2 is taken by way of example. In this case, a dimension of the second inner gate structure INT_GS2 may be measured in a space between the upper surface NS1_US of the bottommost first sheet pattern NS1 and the bottom surface NS1_BS of the middle first sheet pattern NS1 facing each other in the third direction D3.

The first gate electrode 120 may be formed on the first lower pattern BP1. The first gate electrode 120 may intersect the first lower pattern BP1. The first gate electrode 120 may surround the first sheet pattern NS1.

A portion of the first gate electrode 120 may be disposed between the first sheet patterns NS1 adjacent to each other in the third direction D3. When the first sheet patterns NS1 include a lower sheet pattern NS1 and an upper sheet pattern adjacent NS1 to each other in the third direction D3, a portion of the first gate electrode 120 may be disposed between the upper surface NS1_US of the lower sheet pattern NS1 and the bottom surface NS1_BS of the upper sheet pattern NS1 facing each other in the third direction D3. Further, a portion of the first gate electrode 120 may be disposed between the upper surface BS1_US of the first lower pattern BP1 and the bottom surface NS1_BS of the lowest sheet pattern NS1.

The first gate electrode 120 may include at least one of a metal, a metal alloy, a conductive metal nitride, a metal silicide, a doped semiconductor material, a conductive metal oxide, and a conductive metal oxynitride. The first gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. The present disclosure is not limited thereto. The conductive metal oxide and the conductive metal oxynitride may include oxidized products of the above-mentioned materials. The present disclosure is not limited thereto.

The first gate electrode 120 may be disposed on each of both opposing sides of the first source/drain pattern 150. The first gate structure GS1 may be disposed on each of both opposing sides opposite to each other in the first direction D1 of the first source/drain pattern 150.

In one example, each of the first gate electrodes 120 disposed on each of both opposing sides of the first source/drain pattern 150 may be embodied as a normal gate electrode used as a gate of a transistor. In another example, the first gate electrode 120 disposed on one side of the first source/drain pattern 150 may be used as a gate of the transistor, while the first gate electrode 120 disposed on the other side of the first source/drain pattern 150 may act as a dummy gate electrode.

The first gate insulating film 130 may extend along and on an upper surface of the field insulating film 105 and the upper surface BP1_US of the first lower pattern BP1. The first gate insulating film 130 may surround the plurality of first sheet patterns NS1. The first gate insulating film 130 may be disposed along a circumference of the first sheet pattern NS1. The first gate electrode 120 is disposed on the first gate insulating film 130. The first gate insulating film 130 is disposed between the first gate electrode 120 and the first sheet pattern NS1.

A portion of the first gate insulating film 130 may be disposed between the first sheet patterns NS1 adjacent to each other in the third direction D3 and between the first lower pattern BP1 and the first sheet pattern NS1. When the first sheet patterns NS1 include a lower sheet pattern NS1 and an upper sheet pattern NS1 adjacent to each other in the third direction D3, a portion of the first gate insulating film 130 may extend along and on the upper surface NS1_US of the lower sheet pattern NS1, and the bottom surface NS B S of the upper sheet pattern NS1 facing each other in the third direction D3.

The first gate insulating film 130 may include a first gate interfacial insulating film 131 and a first gate high dielectric constant (i.e., high-k) insulating film 132. The first gate high dielectric constant insulating film 132 may be disposed between the first gate interfacial insulating film 131 and the first gate electrode 120. Moreover, the first gate interfacial insulating film 131 may be between the first gate high dielectric constant insulating film 132 and the source/drain pattern 150.

The first gate interfacial insulating film 131 may extend along and on the upper surface BP1_US of the first lower pattern BP1. The first gate interfacial insulating film 131 may extend along the first source/drain pattern 150. The first gate interfacial insulating film 131 may be disposed along a circumference of the first sheet pattern NS1. The first gate interfacial insulating film 131 may directly contact the first lower pattern BP1, the first source/drain pattern 150, and the first sheet pattern NS1.

The first gate interfacial insulating film 131 may not extend along and on the upper surface of the field insulating film 105. The first gate interfacial insulating film 131 may not extend along and on a sidewall of the first gate spacer 140. However, in other embodiments, depending on a scheme of forming the first gate interfacial insulating film 131, the first gate interfacial insulating film 131 may extend along and on the upper surface of the field insulating film 105 and the sidewall of the first gate spacer 140.

The first gate high dielectric constant insulating film 132 may extend along and on the upper surface of the field insulating film 105 and the upper surface BP1_US of the first lower pattern BP1. The first gate high dielectric constant insulating film 132 may extend along the first source/drain pattern 150. The first gate high dielectric constant insulating film 132 may be disposed along a circumference of the first sheet pattern NS1. The first gate high dielectric constant insulating film 132 may extend along and on the sidewall of the first gate spacer 140.

For example, on the upper surface BP1_US of the first lower pattern, a thickness t11 of the first gate interfacial insulating film 131 is smaller than a thickness t12 of the first gate high dielectric constant insulating film 132.

The first gate interfacial insulating film 131 may include at least one of silicon oxide, silicon-germanium oxide, and germanium oxide. The first gate interfacial insulating film 131 may further contain at least one of boron (B), phosphorus (P), carbon (C), arsenic (As), antimony (Sb), and bismuth (Bi). However, the present disclosure is not limited thereto.

The first gate high dielectric constant insulating film 132 may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments may include an NC (negative capacitance) FET using a negative capacitor. In one example, the first gate high dielectric constant insulating film 132 may include a ferroelectric material film having ferroelectric characteristics. In another example, the first gate high dielectric constant insulating film 132 may include a ferroelectric material film having ferroelectric characteristics and a paraelectric material film having paraelectric characteristics.

The ferroelectric material film may have negative capacitance, and the paraelectric material film may have positive capacitance. For example, when two or more capacitors may be connected in series to each other, and a capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In one example, hafnium zirconium oxide may refer to a material obtained by doping hafnium oxide with zirconium (Zr). In another example, hafnium zirconium oxide may refer to a compound of hafnium (Hf), zirconium (Zr), and oxygen (O).

The ferroelectric material film may further contain one or more dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In some embodiments, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nanometers (nm), the present disclosure is not limited thereto. Because a critical thickness exhibiting the ferroelectric properties may vary based on a type of the ferroelectric material, the thickness of the ferroelectric material film may vary depending on the type of the ferroelectric material.

In one example, the high dielectric constant insulating film 132 may include one ferroelectric material film. In another example, the high dielectric constant insulating film 132 may include a plurality of ferroelectric material films spaced apart from each other. The high dielectric constant insulating film 132 may have a stack structure in which a plurality of ferroelectric material films and a plurality of paraelectric material films are alternately stacked with each other.

The first gate spacer 140 may be disposed on a sidewall of the first gate electrode 120. The first gate spacer 140 may not be disposed between the first lower pattern BP1 and the first sheet pattern NS1 or between the first sheet patterns NS1 adjacent to each other in the third direction D3. In the semiconductor device according to some embodiments, the first gate spacer 140 may include only an outer spacer for the first gate electrode 120.

The first gate spacer 140 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and combinations thereof. The present disclosure is not limited thereto. Although the first gate spacer 140 is shown as a single film, this is only for convenience of illustration and the present disclosure is not limited thereto.

The first gate capping pattern 145 may be disposed on the first gate electrode 120 and the first gate spacer 140. An upper surface of the first gate capping pattern 145 may be coplanar with an upper surface of the interlayer insulating film 190. Unlike what is shown, the first gate capping pattern 145 may be disposed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etching selectivity with respect to the interlayer insulating film 190.

The first source/drain pattern 150 may be disposed on the first active pattern AP1. The first source/drain pattern 150 may be disposed on the first lower pattern BP1. The first source/drain pattern 150 is connected to the first sheet pattern NS1. For example, the first source/drain pattern 150 may contact the first sheet pattern NS1.

The first source/drain pattern 150 may be disposed on a side surface of the first gate structure GS1. The first source/drain pattern 150 may be disposed between the first gate structures GS1 adjacent to each other in the first direction D1. For example, the first source/drain pattern 150 may be disposed on each of both opposing sides of the first gate structure GS1. Unlike what is shown, the first source/drain pattern 150 may be disposed on one side of the first gate structure GS1, and may not be disposed on the other side of the first gate structure GS1.

The first source/drain pattern 150 may be included in a source/drain of a transistor using the first sheet pattern NS1 as a channel area thereof.

The first source/drain pattern 150 may be disposed in a first source/drain recess 150R and on top of the bottom insulating liner 151. For example, the source/drain pattern 150 may fill the first source/drain recess 150R above the bottom insulating liner 151.

The first source/drain recess 150R extends in the third direction D3. The first source/drain recess 150R may be between the first gate structures GS1 adjacent to each other in the first direction D1.

A bottom portion (e.g., a bottom surface) of the first source/drain recess 150R is in (e.g., is defined by) the first lower pattern BP1. In the semiconductor device according to some embodiments, a sidewall of the first source/drain recess 150R may be defined by the first sheet pattern NS1 and the inner gate structures INT_GS1, INT_GS2, and INT_GS3. The inner gate structures INT_GS1, INT_GS2, and INT_GS3 may include an upper surface facing the bottom surface NS_BS of the first sheet pattern NS1. The inner gate structures INT_GS1, INT_GS2, and INT_GS3 may include a bottom surface facing the upper surface NS1_US of the first sheet pattern NS1 or the upper surface BP1_US of the first lower pattern BP1. The inner gate structures INT_GS1, INT_GS2, and INT_GS3 may include sidewalls connecting upper surfaces of the inner gate structures INT_GS1, INT_GS2, and INT_GS3 and bottom surfaces of the inner gate structures INT_GS1, INT_GS2, and INT_GS3 to each other. The sidewalls of the inner gate structures INT_GS1, INT_GS2, and INT_GS3 may define a portion of a sidewall of the first source/drain recess 150R.

In an area between the lowermost first sheet pattern NS1 and the first lower pattern BP1, a boundary between the first gate insulating film 130 and the first lower pattern BP1 may be at/defined by the upper surface BP1_US of the first lower pattern. The upper surface BP1_US of the first lower pattern BP1 may be at/defined by a boundary between the third inner gate structure INT_GS3 and the first lower pattern BP1. A vertical level of a bottom surface of the first source/drain recess 150R is lower than that of the upper surface BP1_US of the first lower pattern.

A sidewall of the first source/drain recess 150R may have a wavy shape. The first source/drain recess 150R may include a plurality of width extension areas 150R_ER. The width extension areas 150R_ER of each of the first source/drain recesses 150R may be defined above the upper surface BP1_US of the first lower pattern BP1.

The width extension areas 150R_ER of the first source/drain recess 150R may be defined between the first sheet patterns NS1 adjacent to each other in the third direction D3. Moreover, one of the width extension areas 150R_ER of the first source/drain recess may be defined between the first lower pattern BP1 and the first sheet pattern NS1. The width extension areas 150R_ER of the first source/drain recess 150R may extend into a space between the first sheet patterns NS1 adjacent to each other in the third direction D3. The width extension area 150R_ER of the first source/drain recess 150R may be defined between the inner gate structures INT_GS1, INT_GS2, and INT_GS3 adjacent to each other in the first direction D1.

The width extension areas 150R_ER of each of the first source/drain recesses 150R may each have a portion whose a dimension in the first direction D1 increases, and a portion whose a dimension in the first direction D1 decreases as the width extension area 150R_ER extends away from the upper surface BP1_US of the first lower pattern BP1. For example, as the width extension area 150R_ER extends away from the upper surface BP1_US of the first lower pattern BP1, the dimension in the first direction D1 of the width extension area 150R_ER may increase and then decrease.

In the width extension area 150R_ER, a point at which the dimension in the first direction D1 of the width extension area 150R_ER is maximum may be positioned between the first sheet pattern NS1 and the first lower pattern BP1, or between the first sheet patterns NS1 adjacent to each other in the third direction D3.

The first source/drain pattern 150 may contact the first sheet pattern NS1 and the first lower pattern BP1. Since the first gate spacer 140 is not disposed between the adjacent first sheet patterns NS1 and between the first lower pattern BP1 and the first sheet pattern NS1, the inner gate structures INT_GS1, INT_GS2, and INT_GS3 may contact the first source/drain pattern 150. The first gate insulating film 130 of each of the inner gate structures INT_GS1, INT_GS2, and INT_GS3 may contact the first source/drain pattern 150.

The first source/drain pattern 150 may include an epitaxial pattern. The first source/drain pattern 150 includes a semiconductor material.

The first source/drain pattern 150 may include, for example, silicon or germanium as an elemental semiconductor material. Further, the first source/drain pattern 150 may include, for example, a binary compound including two of carbon (C), silicon (Si), germanium (Ge), and tin (Sn), a ternary compound including three thereof, or the binary compound or the ternary compound containing a group IV element doped thereto. For example, the first source/drain pattern 150 may include silicon, silicon-germanium, silicon carbide, etc. The present disclosure, however, is not limited thereto.

The first source/drain pattern 150 may include an impurity-doped semiconductor material. For example, the first source/drain pattern 150 may contain an n-type impurity. The doped impurity may include at least one of phosphorus (P), arsenic (As), antimony (Sb), and bismuth (Bi).

Although the first source/drain pattern 150 is shown as a single film, this is only for convenience of illustration and the present disclosure is not limited thereto.

The bottom insulating liner 151 is disposed on the first lower pattern BP1. For example, the bottom insulating liner 151 may be in contact with the first lower pattern BP1.

The bottom insulating liner 151 is disposed between the first source/drain pattern 150 and the first lower pattern BP1. The first source/drain pattern 150 is disposed on (e.g., in contact with) the bottom insulating liner 151.

Each of the first sheet patterns NS1 does not overlap (i.e., is non-overlapping with) the bottom insulating liner 151 in the third direction D3. Accordingly, the bottom insulating liner 151 is not overlapped by any of the sheet patterns NS1 in the third direction D3.

The bottom insulating liner 151 may be in the bottom portion of (e.g., may cover at least a portion of the bottom surface of) the first source/drain recess 150R. The bottom insulating liner 151 may extend along and on at least a portion of the bottom surface of the first source/drain recess 150R.

In the semiconductor device according to some embodiments, the bottom insulating liner 151 may cover an entirety of the bottom surface of the first source/drain recess 150R. The bottom insulating liner 151 may extend along and on the entirety of the bottom surface of the first source/drain recess 150R. For example, the bottom insulating liner 151 may contact the entirety of the bottom surface of the first source/drain recess 150R (e.g., the entirety of a recessed surface of the first lower pattern BP1 defining the bottom surface of the first source/drain recess 150R). Accordingly, the first source/drain pattern 150 may not contact the first lower pattern BP1 defining the bottom surface of the first source/drain recess 150R. The recessed (e.g., curved) surface of the first lower pattern BP1 is recessed downward in the third direction D3 away from the upper surface BP1_US (e.g., a planar surface) of the first lower pattern BP1.

A vertical dimension (e.g., distance) H12 between the topmost portion of the bottom insulating liner 151 and the lowermost portion of the first source/drain recess 150R is equal to or smaller than a vertical dimension H11 between the upper surface BP1_US of the first lower pattern BP1 and the lowermost portion (e.g., the bottommost point/portion of the bottom portion) of the first source/drain recess 150R. For example, the vertical dimension H12 may be equal to the vertical dimension H11.

A bottom surface 151BS of the bottom insulating liner 151 may be convex downwardly toward the first lower pattern BP1. An upper surface 151US of the bottom insulating liner 151 may be convex downwardly toward the first lower pattern BP1. The upper surface 151US of the bottom insulating liner 151 may have a concave shape. For example, the bottom insulating liner 151 may have a shape similar to a crescent or old moon. Moreover, the upper surface 151US of the bottom insulating liner 151 may contact a bottom surface of the first source/drain pattern 150.

A thickness (i.e., a distance between the bottom and upper surfaces 151BS, 151US) of the bottom insulating liner 151 in the third direction D3 may increase and then decrease as the bottom insulating liner 151 extends away from the first gate structure GS1 (e.g., as a distance between the bottom insulating liner 151 and the first gate structure GS1 increases in the first direction D1). At a position of the bottom insulating liner 151 closest to the upper surface BP1_US of the first lower pattern BP1, the thickness of the bottom insulating liner 151 may be the smallest. At a position of the bottom insulating liner 151 adjacent to the lowest portion of the first source/drain recess 150R, the thickness of the bottom insulating liner 151 may be the largest. However, the present disclosure is not limited thereto.

In FIG. 2, two first gate structures GS1 adjacent to each other in the first direction D1 may be referred to as a first sub-gate structure and a second sub-gate structure. The bottom insulating liner 151 may be disposed between the first sub-gate structure GS1 and the second sub-gate structure GS1. As the bottom insulating liner 151 extends between the first sub-gate structure GS1 to the second sub-gate structure GS1 and in the first direction D1, a thickness of the bottom insulating liner 151 may increase and then decrease.

The bottom insulating liner 151 includes an insulating material. The bottom insulating liner 151 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and combinations thereof. The present disclosure, however, is not limited thereto.

If the bottom insulating liner 151 were omitted, an n-type impurity doped into the first source/drain pattern 150 may diffuse to the first lower pattern BP1 overlapped by the first gate structure GS1 in the third direction D3. The n-type impurity diffused into a portion under the first gate structure GS1 thus may cause leakage current during element operation.

According to various embodiments, however, the bottom insulating liner 151 is disposed between the first source/drain pattern 150 and the first lower pattern BP1. The bottom insulating liner 151 prevents or reduces the diffusion of the n-type impurity doped into the first source/drain pattern 150 into the first lower pattern BP1. That is, disposing the bottom insulating liner 151 may allow a leakage current path in the first lower pattern BP1 to be blocked or reduced. Therefore, since the bottom insulating liner 151 is used, the leakage current of the semiconductor device may be reduced. Accordingly, performance and reliability of the semiconductor device may be increased.

A source/drain etch stopper film 185 may extend along and on an outer sidewall of the first gate spacer 140 and a profile of the first source/drain pattern 150. Although not shown, the source/drain etch stopper film 185 may be disposed on the upper surface of the field insulating film 105.

The source/drain etch stopper film 185 may include a material having an etch selectivity with respect to the interlayer insulating film 190. The source/drain etch stopper film 185 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and combinations thereof. The present disclosure, however, is not limited thereto.

The interlayer insulating film 190 may be disposed on the source/drain etch stopper film 185. The interlayer insulating film 190 may be disposed on the first source/drain pattern 150. The interlayer insulating film 190 may not cover an upper surface of the first gate capping pattern 145. For example, the upper surface of the interlayer insulating film 190 may be coplanar with the upper surface of the first gate capping pattern 145.

The interlayer insulating film 190 may include, for example, at least one of silicon oxide, silicon nitride, silicon oxynitride, and a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or a combination thereof. The present disclosure, however, is not limited thereto.

A first source/drain contact 180 is disposed on the first source/drain pattern 150. The first source/drain contact 180 is connected to the first source/drain pattern 150. The first source/drain contact 180 may extend through the interlayer insulating film 190 and the source/drain etch stopper film 185 and may be connected to the first source/drain pattern 150.

A first metal silicide layer 155 may be further disposed between the first source/drain contact 180 and the first source/drain pattern 150.

It is shown that a vertical dimension between a bottom surface of the first source/drain contact 180 and the upper surface BP1_US of the first lower pattern is equal to or larger than a vertical dimension between the bottom surface NS1_US of the topmost first sheet pattern NS1 and the upper surface BP1_US of the first lower pattern. However, the present disclosure is not limited thereto.

Unlike what is shown, the bottom surface of the first source/drain contact 180 may be located between the bottom surface NS1_BS of the bottommost first sheet pattern NS1 and the bottom surface NS1_BS of the topmost first sheet pattern NS1.

Although the first source/drain contact 180 is shown as a single film, this is only for convenience of illustration and the present disclosure is not limited thereto. The first source/drain contact 180 may include, for example, at least one of metal, metal alloy, conductive metal nitride, conductive metal carbide, conductive metal oxide, conductive metal carbonitride and a two-dimensional (2D) material.

The first metal silicide layer 155 may include metal silicide.

Figure 5:
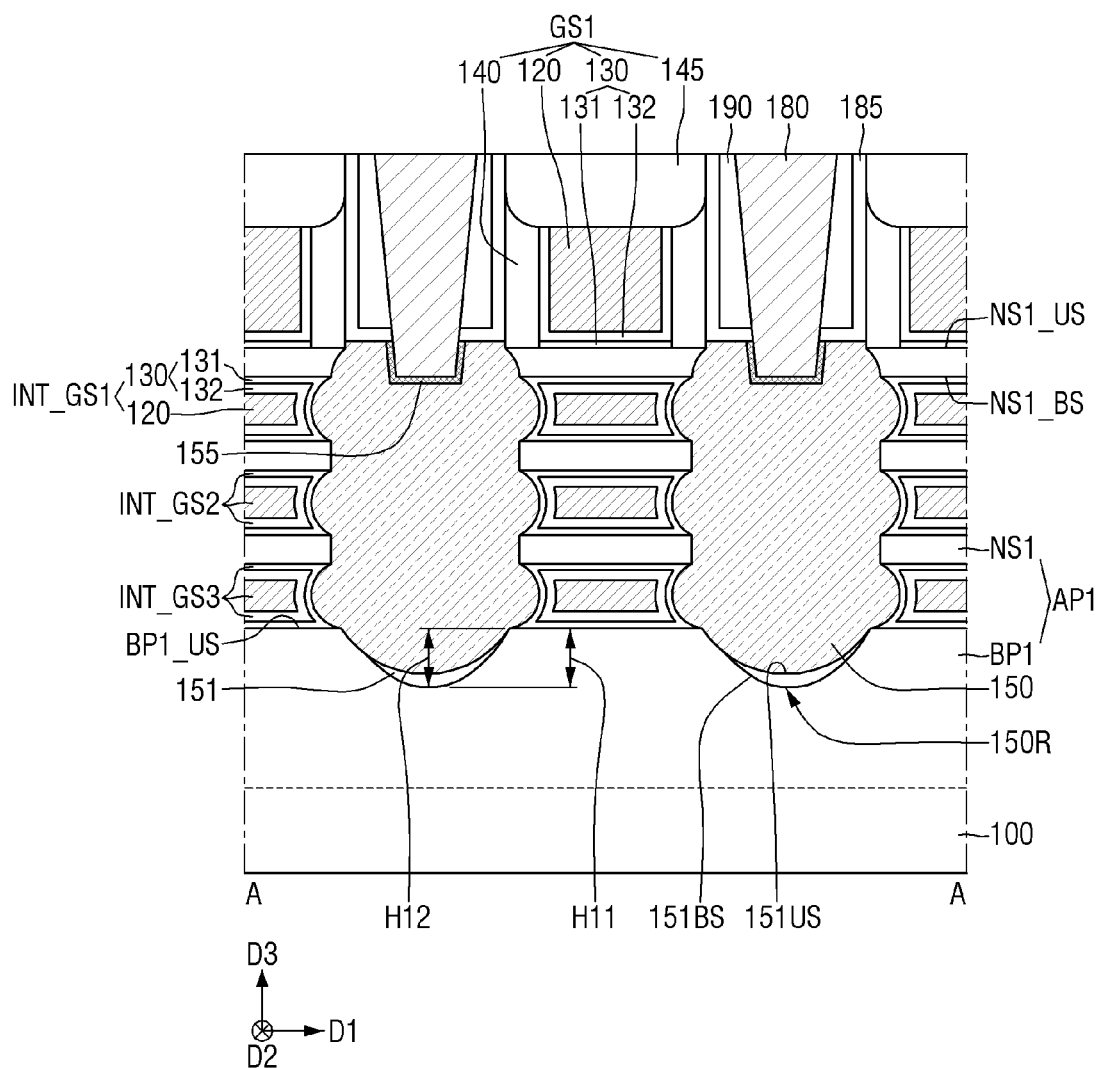
FIG. 5 is a cross-sectional diagram for illustrating a semiconductor device according to some embodiments.
Figure 6:
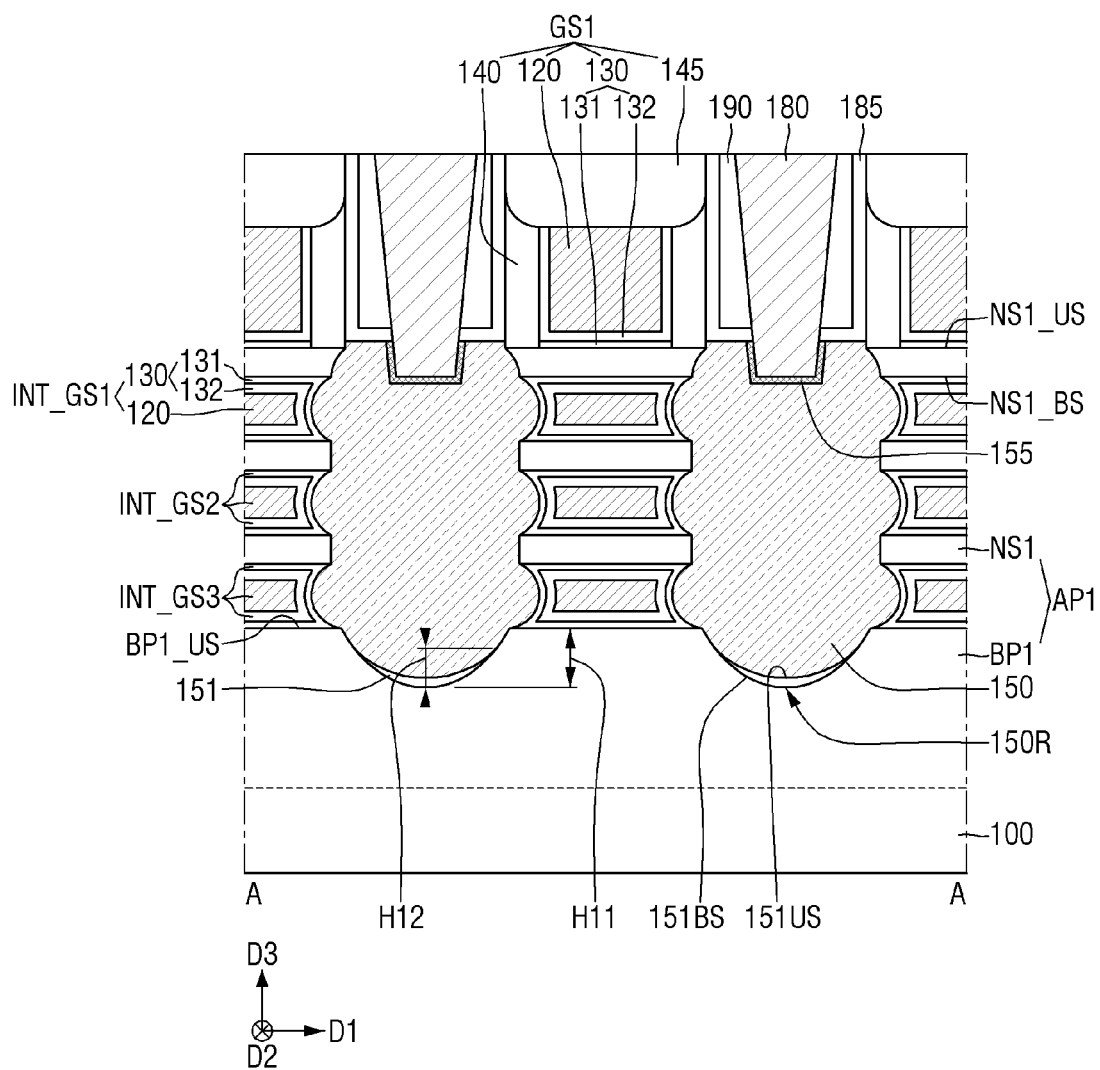
FIG. 6 is a cross-sectional diagram for illustrating a semiconductor device according to some embodiments.

FIG. 5 is a diagram for illustrating a semiconductor device according to some embodiments. FIG. 6 is a diagram for illustrating a semiconductor device according to some embodiments. For convenience of illustration, the following description is based on differences thereof from those as described above with reference to FIG. 1 to FIG. 4.

Referring to FIGS. 5 and 6, in the semiconductor device according to some embodiments, the bottom insulating liner 151 may cover a portion of the bottom surface of the first source/drain recess 150R.

The bottom insulating liner 151 may extend along and on a portion of the bottom surface of the first source/drain recess 150R. For example, the bottom insulating liner 151 may contact a portion of the bottom surface of the first source/drain recess 150R.

The first source/drain pattern 150 may contact the first lower pattern BP1 defining the bottom surface of the first source/drain recess 150R.

In FIG. 5, the vertical dimension H12 between the topmost portion of the bottom insulating liner 151 and the lowermost portion of the first source/drain recess 150R is equal to the vertical dimension H11 between the upper surface BP1_US of the first lower pattern BP1 and the lowermost portion of the first source/drain recess 150R.

In FIG. 6, the vertical dimension H12 between the topmost portion of the bottom insulating liner 151 and the lowermost portion of the first source/drain recess 150R is smaller than the vertical dimension H11 between the upper surface BP1_US of the first lower pattern BP1 and the lowermost portion of the first source/drain recess 150R.

Figure 7:
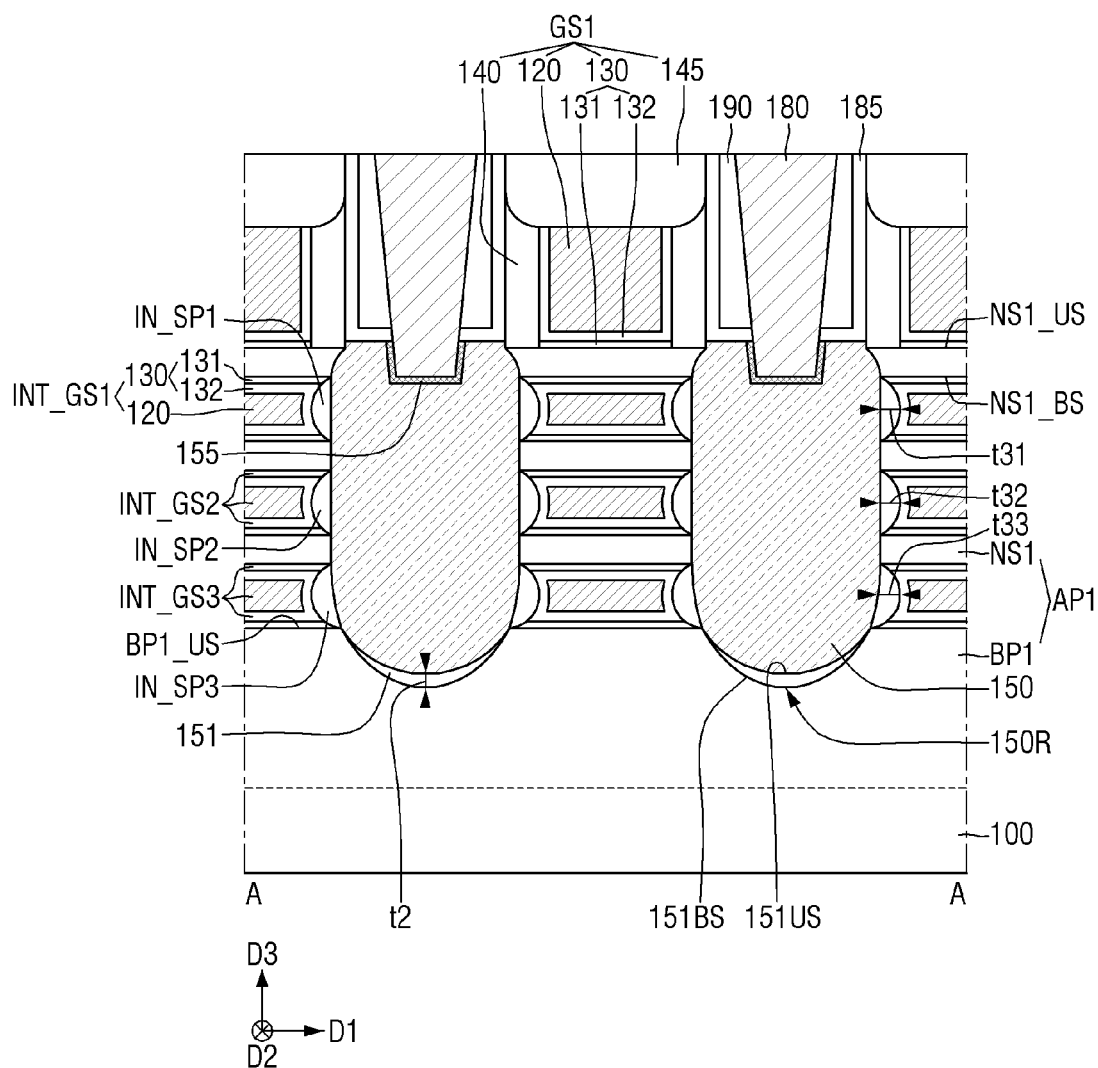
FIG. 7 is a cross-sectional diagram for illustrating a semiconductor device according to some embodiments.
Figure 8:
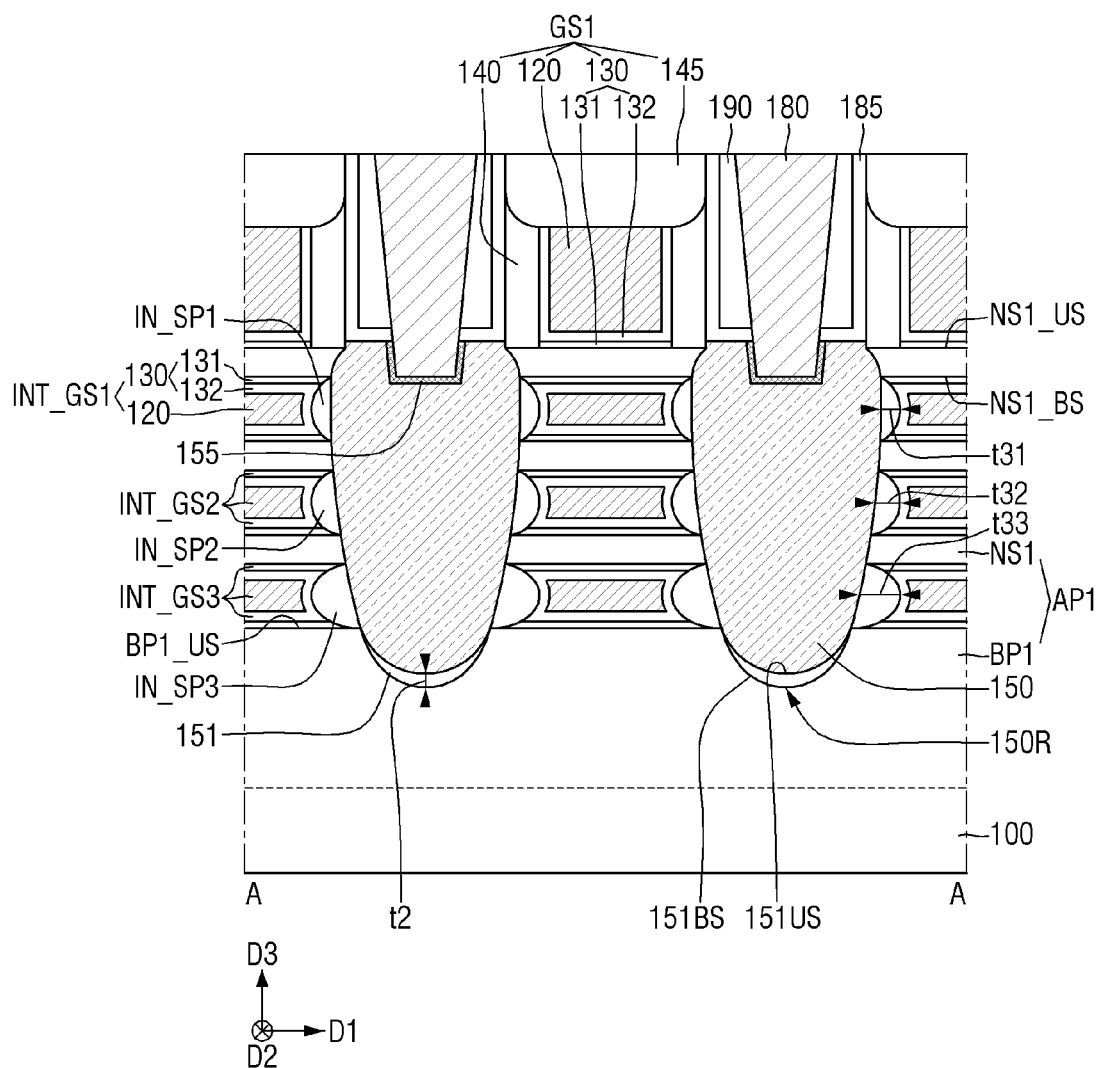
FIG. 8 is a cross-sectional diagram for illustrating a semiconductor device according to some embodiments.

FIG. 7 is a diagram for illustrating a semiconductor device according to some embodiments. FIG. 8 is a diagram for illustrating a semiconductor device according to some embodiments. For convenience of illustration, the following description is based on differences thereof from those as described above with reference to FIG. 1 to FIG. 4.

Referring to FIG. 7 and FIG. 8, in the semiconductor device according to some embodiments, the first gate structure GS1 further includes a plurality of inner spacers IN_SP1, IN_SP2, and IN_SP3.

The plurality of inner spacers IN_SP1, IN_SP2, and IN_SP3 may be disposed between the first sheet patterns NS1 adjacent to each other in the third direction D3 and between the first lower pattern BP1 and the first sheet pattern NS1. The inner spacers IN_SP1, IN_SP2, and IN_SP3 may be disposed between the upper surface BP1_US of the first lower pattern BP1 and the bottom surface NS1_BS of the lowest sheet pattern NS1, and between the upper surface NS1_US of any first sheet pattern NS1 and the bottom surface NS1_BS of another first sheet pattern NS1 facing each other in the third direction D3.

The inner spacers IN_SP1, IN_SP2, and IN_SP3 contact the upper surface BP1_US of the first lower pattern BP1, the upper surface NS1_US of the first sheet pattern NS1, and the bottom surface NS1_BS of the first sheet pattern NS1.

The inner spacers IN_SP1, IN_SP2, and IN_SP3 are disposed between the inner gate structures INT_GS1, INT_GS2, and INT_GS3 and the first source/drain pattern 150. The number of inner spacers IN_SP1, IN_SP2, and IN_SP3 arranged in the third direction D3 is the same as the number of the inner gate structures INT_GS1, INT_GS2, and INT_GS3.

The first gate spacer 140 may include a first inner spacer IN_SP1, a second inner spacer IN_SP2, and a third inner spacer IN_SP3. The first inner spacer IN_SP1, the second inner spacer IN_SP2, and the third inner spacer IN_SP3 may be sequentially and vertically arranged on the first lower pattern BP1.

The third inner spacer IN_SP3 may be disposed between the first lower pattern BP1 and the first sheet pattern NS1. The third inner spacer IN_SP3 may constitute the bottommost one of the inner spacers IN_SP1, IN_SP2, and IN_SP3.

The third inner spacer IN_SP3 may contact the upper surface BP1_US of the first lower pattern BP1.

Each of the first inner spacer IN_SP1 and the second inner spacer IN_SP2 may be disposed between the first sheet patterns NS1 adjacent to each other in the third direction D3. The first inner spacer IN_SP1 may constitute the topmost one of the inner spacers IN_SP1, IN_SP2, and IN_SP3. The inner spacers IN_SP1, IN_SP2, and IN_SP3 may contact the bottom surface NS1_BS of the topmost first sheet pattern NS1. The second inner spacer IN_SP2 is disposed between the first inner spacer IN_SP1 and the third inner spacer IN_SP3.

The first gate interfacial insulating film 131 may not extend along and on sidewalls of the inner spacers IN_SP1, IN_SP2, and IN_SP3. The first gate high dielectric constant insulating film 132 extends along the sidewalls of the inner spacers IN_SP1, IN_SP2, and IN_SP3. However, depending on a scheme of forming the first gate interfacial insulating film 131, the first gate interfacial insulating film 131 may extend along and on the sidewalls of the inner spacers IN_SP1, IN_SP2, and IN_SP3.

Under the arrangement of the inner spacers IN_SP1, IN_SP2, and IN_SP3, the inner gate structures INT_GS1, INT_GS2, and INT_GS3 do not contact the first source/drain pattern 150.

A sidewall of the first source/drain recess 150R may be defined by the first sheet pattern NS1 and the inner spacers IN_SP1, IN_SP2, and IN_SP3. The first source/drain recess 150R does not include the width extension area 150R_ER (FIG. 2).

Each of the inner spacers IN_SP1, IN_SP2, and IN_SP3 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and combinations thereof. The present disclosure, however, is not limited thereto.

In FIG. 7, a thickness t31 of the first inner spacer IN_SP1 in the first direction D1 may be equal to a thickness t32 of the second inner spacer IN_SP2 in the first direction D1. A thickness t33 of the third inner spacer IN_SP3 in the first direction D1 may be equal to the thickness t32 of the second inner spacer IN_SP2 in the first direction D1.

The second inner spacer IN_SP2 is taken by way of example. The thickness t32 of the second inner spacer IN_SP2 may be measured in a space between the upper surface NS1_US of any first sheet pattern NS1 and the bottom surface NS1_BS of another first sheet pattern NS1 adjacent thereto in the third direction D3.

In FIG. 8, the thickness t31 of the first inner spacer IN_SP1 in the first direction D1 may be smaller than the thickness t32 of the second inner spacer IN_SP2 in the first direction D1. The thickness t33 of the third inner spacer IN_SP3 in the first direction D1 may be greater than the thickness t32 of the second inner spacer IN_SP2 in the first direction D1.

Unlike what is illustrated, the thickness t31 of the first inner spacer IN_SP1 in the first direction D1 may be equal to the thickness t32 of the second inner spacer IN_SP2 in the first direction D1.

In FIG. 7 and FIG. 8, the thickness t31 of the first inner spacer IN_SP1, the thickness t32 of the second inner spacer IN_SP2, and the thickness t33 of the third inner spacer IN_SP3 may be greater than a thickness t2 of the bottom insulating liner 151 in the third direction D3.

However, depending on a depth by which the first source/drain recess 150R is recessed into the first lower pattern BP1, the thickness t2 of the bottom insulating liner 151 in the third direction D3 may vary. That is, in one example, unlike what is illustrated, the thickness t2 of the bottom insulating liner 151 in the third direction D3 may be equal to or greater than the thickness t31 of the first inner spacer IN_SP1. In another example, unlike what is illustrated, the thickness t2 of the bottom insulating liner 151 in the third direction D3 may be equal to or greater than the thickness t32 of the second inner spacer IN_SP2. In another example, unlike what is illustrated, the thickness t2 of the bottom insulating liner 151 in the third direction D3 may be equal to or greater than the thickness t33 of the third inner spacer IN_SP3.

Figure 9:
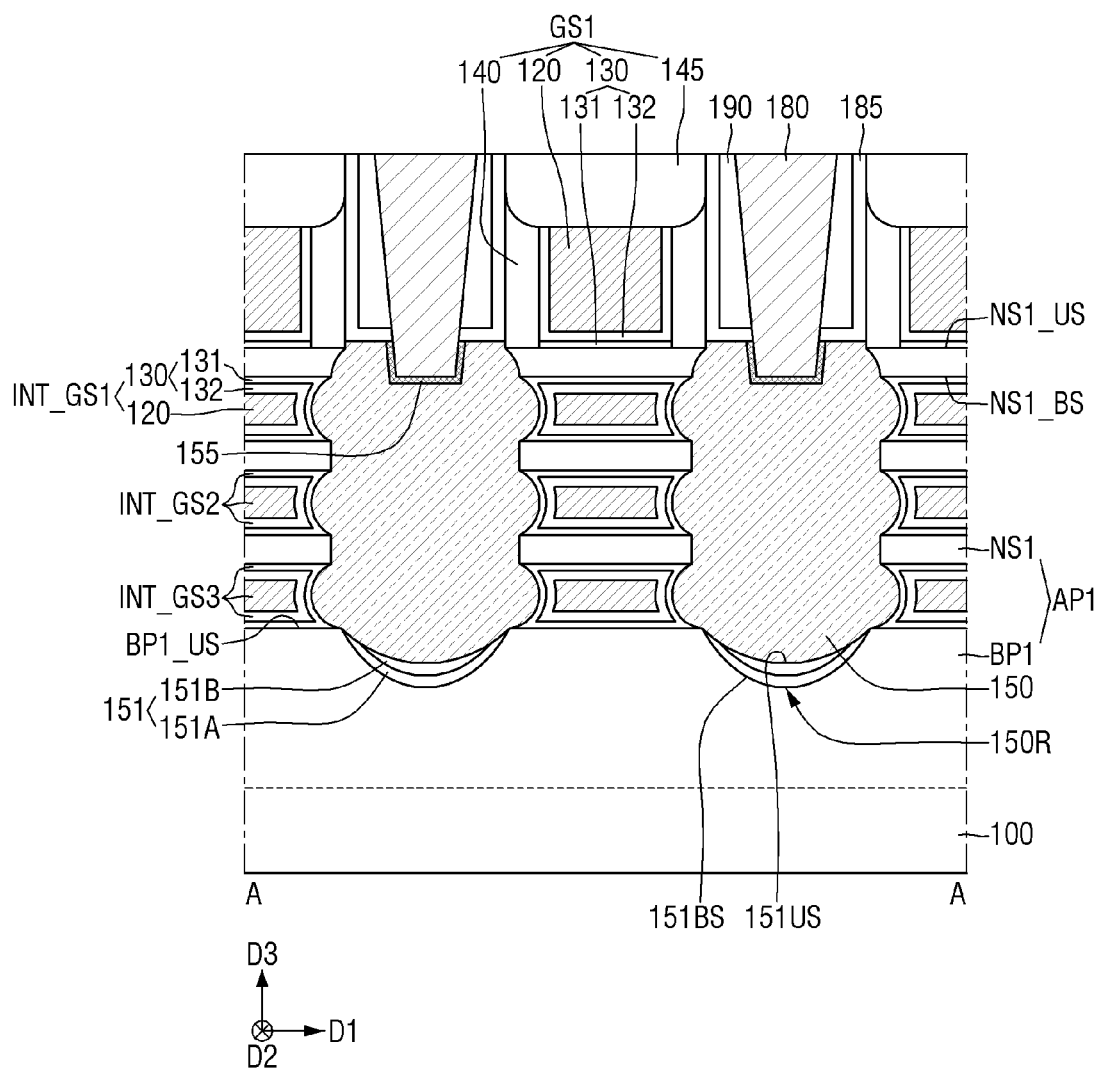
FIG. 9 is a cross-sectional diagram for illustrating a semiconductor device according to some embodiments.
Figure 10:
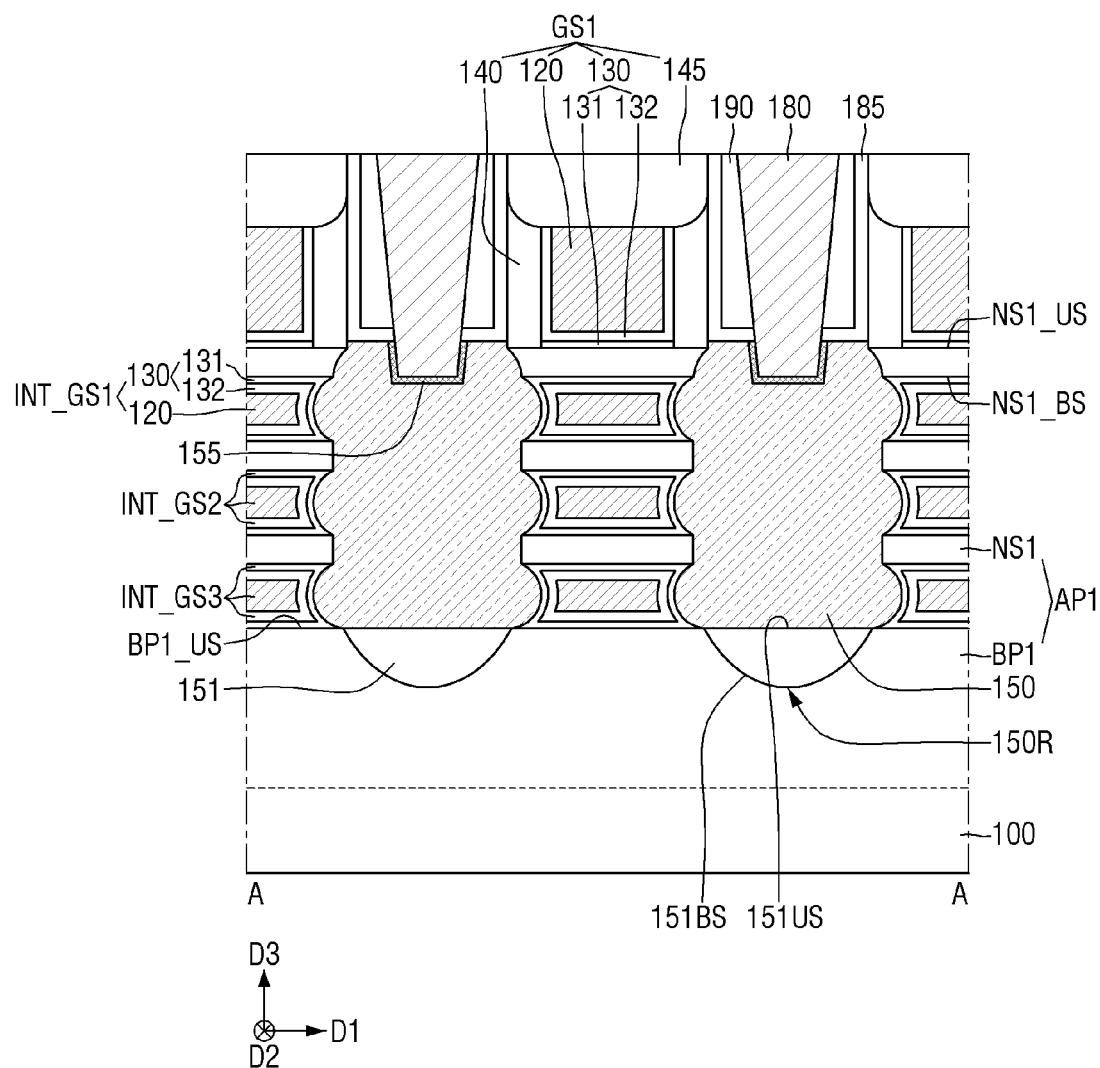
FIG. 10 is a cross-sectional diagram for illustrating a semiconductor device according to some embodiments.
Figure 11:
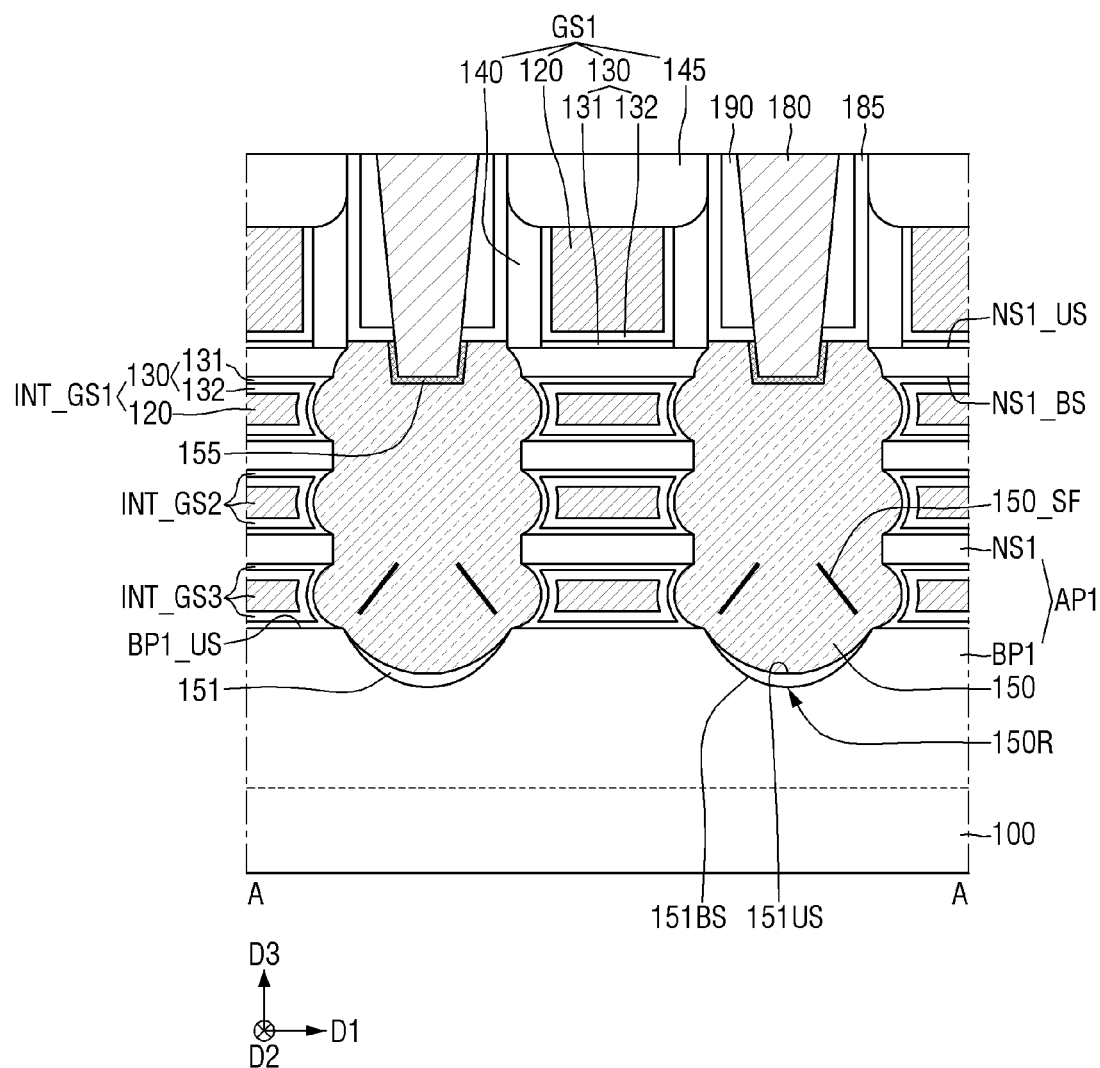
FIG. 11 is a cross-sectional diagram for illustrating a semiconductor device according to some embodiments.

FIG. 9 is a diagram for illustrating a semiconductor device according to some embodiments. FIG. 10 is a diagram for illustrating a semiconductor device according to some embodiments. FIG. 11 is a diagram for illustrating a semiconductor device according to some embodiments. For convenience of illustration, the following description is based on differences thereof from those as described above with reference to FIG. 1 to FIG. 4.

Referring to FIG. 9, in the semiconductor device according to some embodiments, the bottom insulating liner 151 may include a plurality of sub-bottom insulating liners 151A and 151B.

The bottom insulating liner 151 may include a first sub-bottom insulating liner 151A and a second sub-bottom insulating liner 151B sequentially and vertically arranged on the first lower pattern BP1. The second sub-bottom insulating liner 151B may be disposed on an upper surface of the first sub-bottom insulating liner 151A. Accordingly, the first sub-bottom insulating liner 151A may be between the second sub-bottom insulating liner 151B and the recessed surface of the first lower pattern BP1.

The first sub-bottom insulating liner 151A may contact the first lower pattern BP1. The second sub-bottom insulating liner 151B may not contact the first lower pattern BP1.

Each of the first sub-bottom insulating liner 151A and the second sub-bottom insulating liner 151B may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and combinations thereof. The present disclosure, however, is not limited thereto.

In the semiconductor device according to some embodiments of FIG. 10, the upper surface 151US of the bottom liner 151 may be a flat surface.

Although the upper surface 151US of the bottom insulating liner 151 is shown to be coplanar with the upper surface BP1_US of the first lower pattern BP1, the present disclosure is not limited thereto.

Referring to FIG. 11, in the semiconductor device according to some embodiments, the first source/drain pattern 150 may include a stacking fault 150_SF.

In a cross-sectional view cut in the first direction D1, one first source/drain pattern 150 is illustrated as including two stacking faults 150_SF. However, this is only for convenience of illustration and the present disclosure is not limited thereto.

Figure 12:
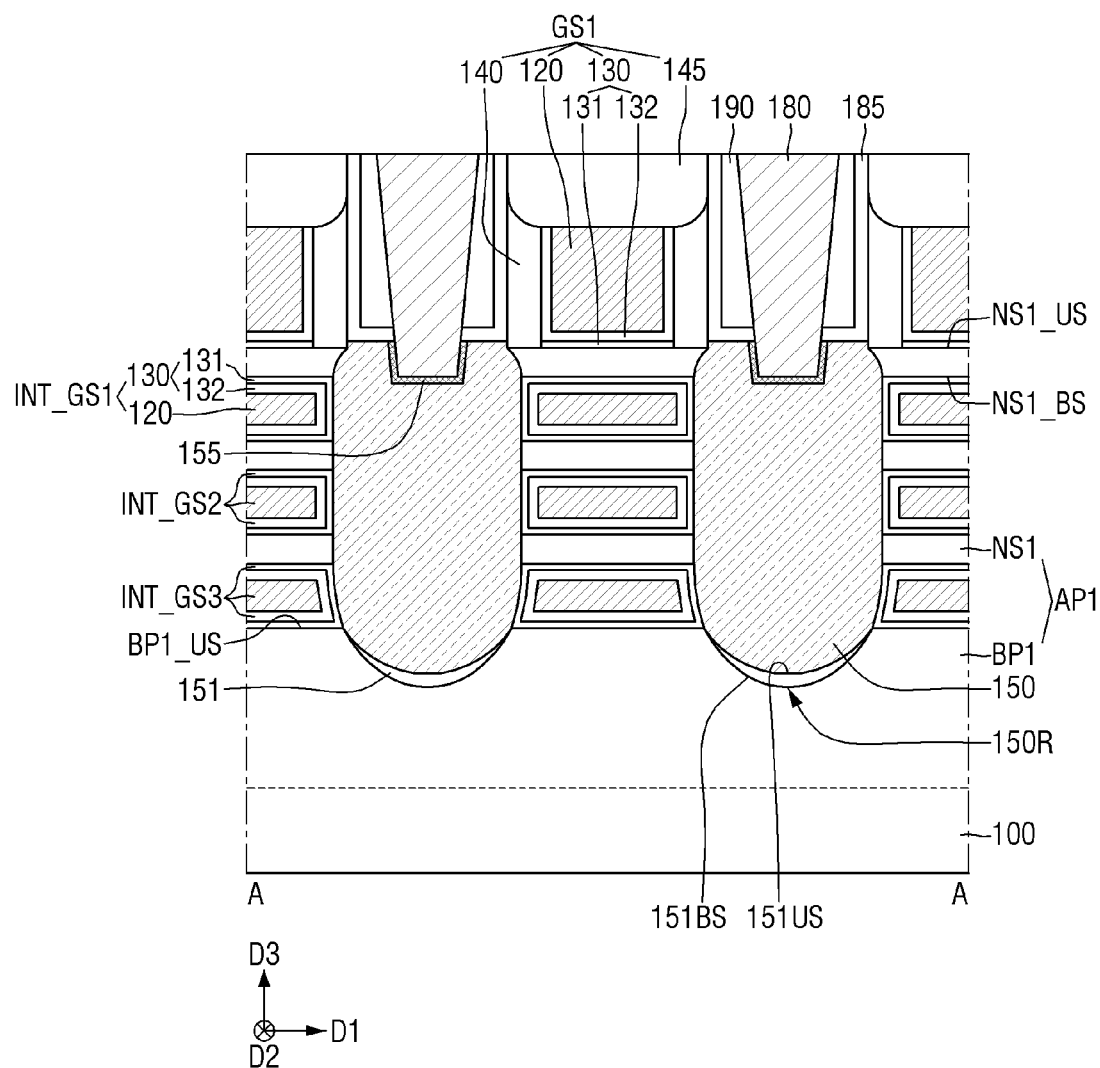
FIG. 12 is a cross-sectional diagram for illustrating a semiconductor device according to some embodiments.
Figure 13:
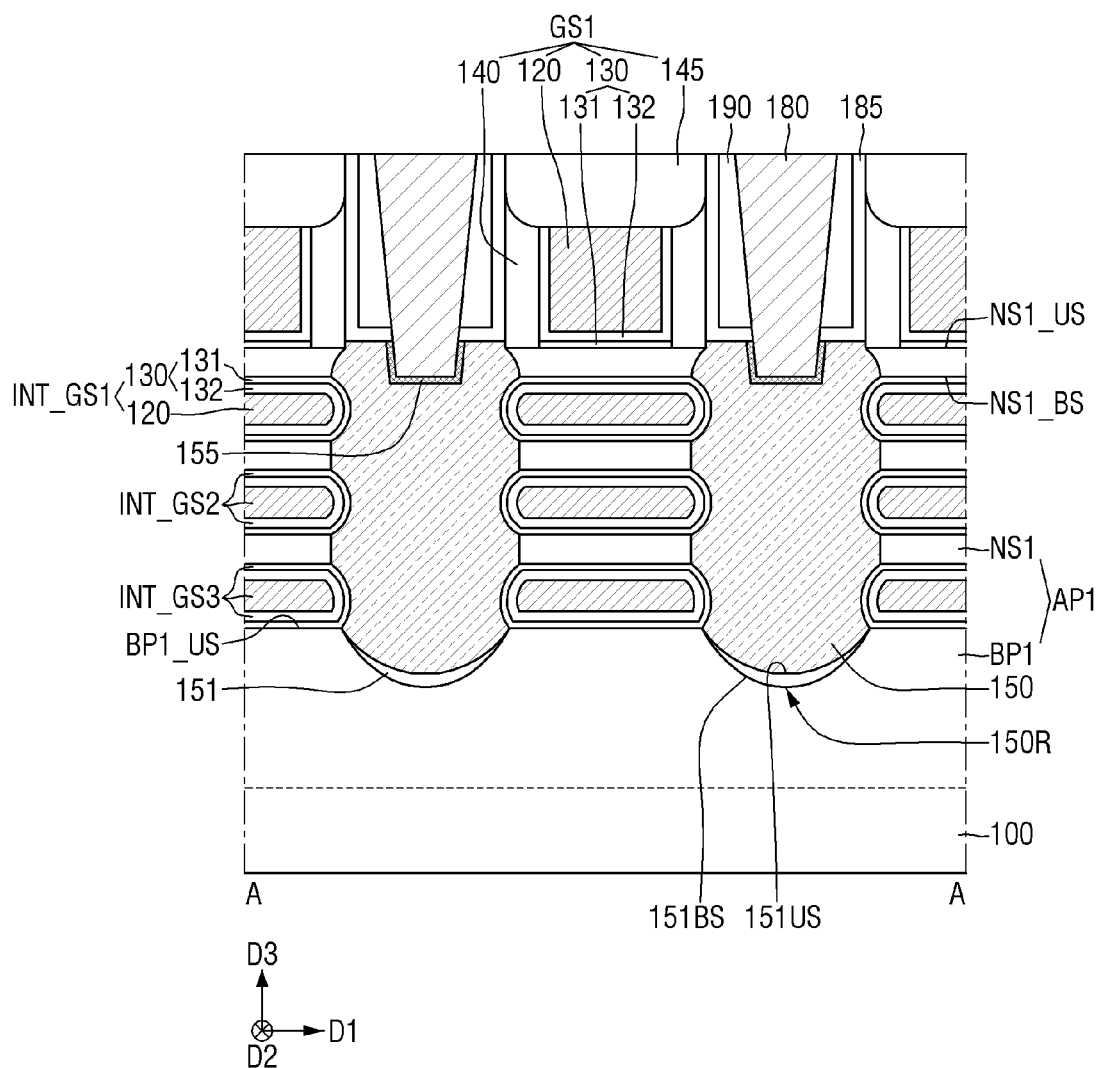
FIG. 13 is a cross-sectional diagram for illustrating a semiconductor device according to some embodiments.

FIG. 12 is a diagram for illustrating a semiconductor device according to some embodiments. FIG. 13 is a diagram for illustrating a semiconductor device according to some embodiments. For convenience of illustration, the following description is based on differences thereof from those as described above with reference to FIG. 1 to FIG. 4.

Referring to FIG. 12, in the semiconductor device according to some embodiments, the first source/drain recess 150R does not include a plurality of width extension areas 150R_ER (FIG. 2).

A sidewall of the first source/drain recess 150R does not have a wavy shape. An upper portion of a sidewall of the first source/drain recess 150R (e.g., adjacent the uppermost sheet pattern NS1) may decrease in a dimension in the first direction D1 as the sidewall of the first source/drain recess 150R extends away from the first lower pattern BP1.

Referring to FIG. 13, in the semiconductor device according to some embodiments, the inner gate structures INT_GS1, INT_GS2, and INT_GS3 may protrude in the first direction D1 toward the first source/drain pattern 150 beyond at least one first sheet pattern NS1.

For example, a portion of the first inner gate structure INT_GS1 and a portion of the second inner gate structure INT_GS2 may protrude toward the first source/drain pattern 150 beyond the first sheet pattern NS1 between the first inner gate structure INT_GS1 and the second inner gate structure INT_GS2.

A portion of the second inner gate structure INT_GS2 and a portion of the third inner gate structure INT_GS3 may protrude toward the first source/drain pattern 150 beyond the first sheet pattern NS1 between the second inner gate structure INT_GS2 and the third inner gate structure INT_GS3.

Figure 14:
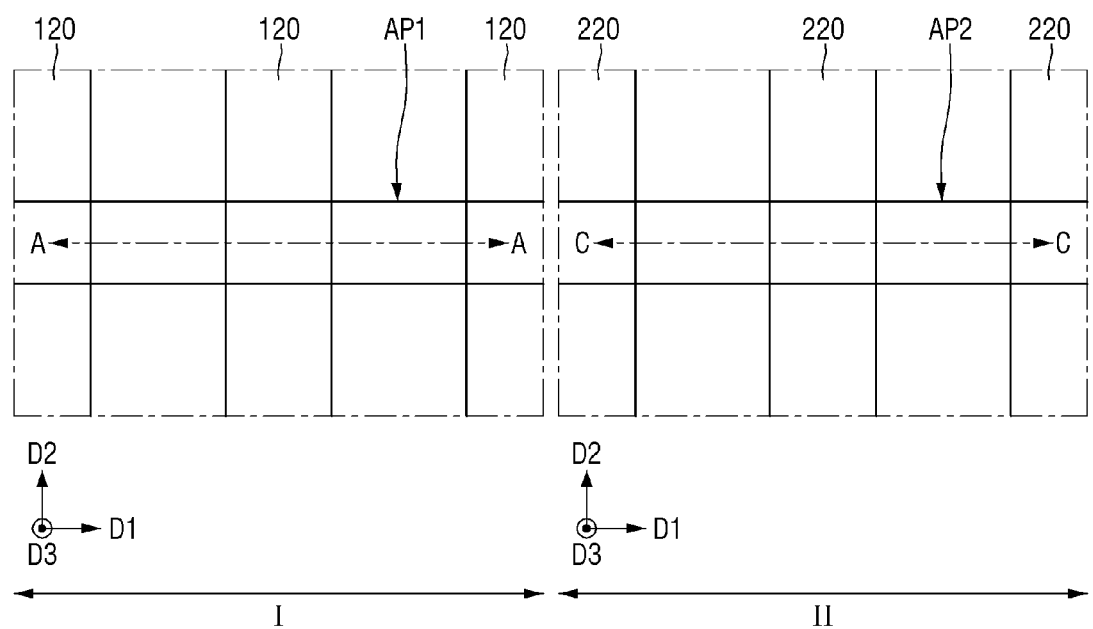
FIG. 14 is an illustrative layout diagram for illustrating a semiconductor device according to some embodiments.
Figure 15:
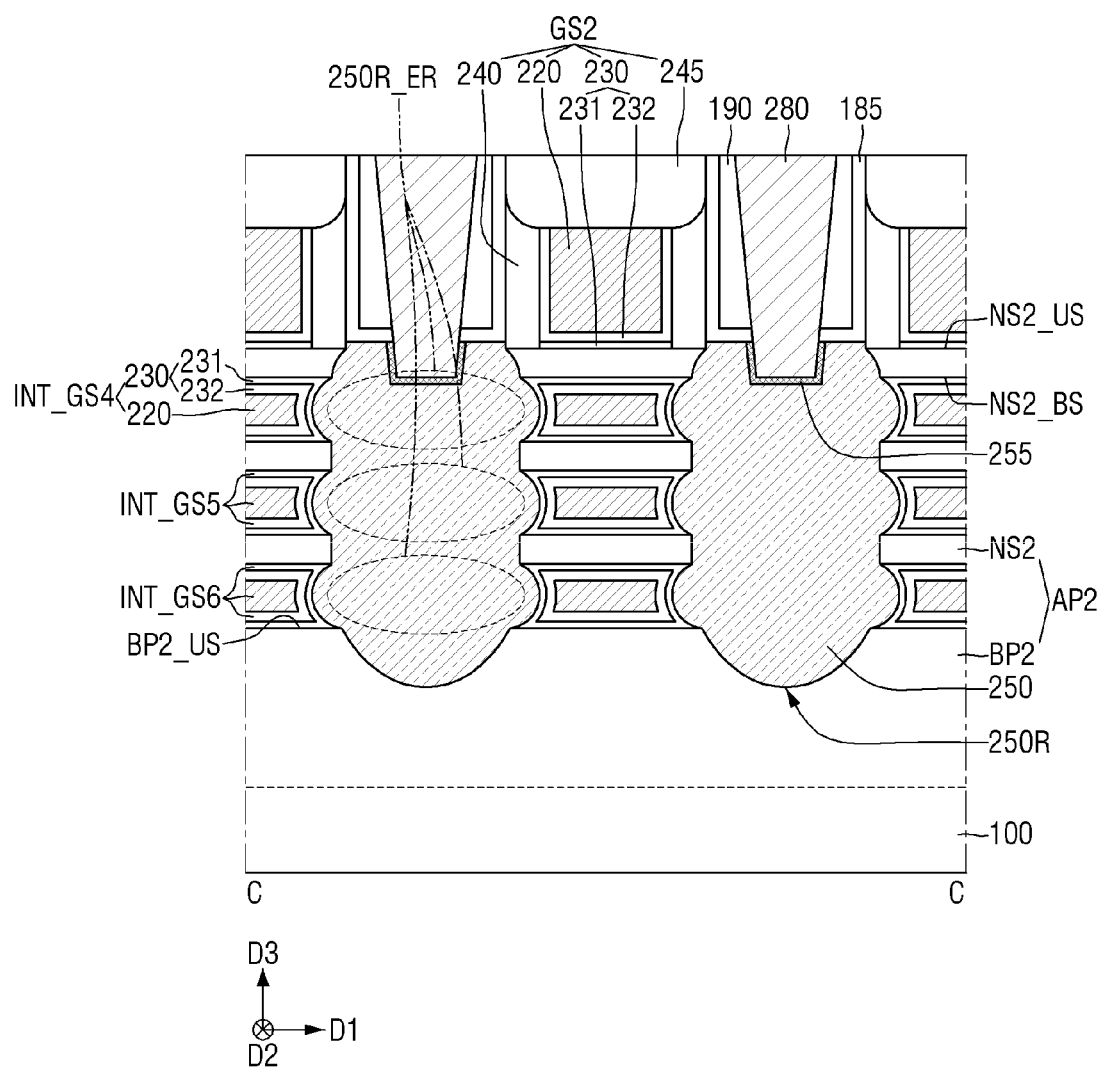
FIG. 15 is a cross-sectional view taken along line C-C of FIG. 14.

FIG. 14 is an illustrative layout diagram for illustrating a semiconductor device according to some embodiments. FIG. 15 is a cross-sectional view taken along line C-C of FIG. 14.

For reference, a cross-sectional view taken along line A-A of FIG. 14 may be the same as one of FIG. 2, FIG. 5 to FIG. 13. In addition, description of a first area I in FIG. 14 may be substantially the same as the description using FIG. 1 to FIG. 13. Therefore, the following description is mainly based on a second area II in FIG. 14.

Referring to FIG. 14 and FIG. 15, the semiconductor device according to some embodiments may include the first active pattern AP1, the plurality of first gate electrodes 120, a second active pattern AP2, a plurality of second gate electrodes 220, the first source/drain pattern 150 (FIG. 2), a second source/drain pattern 250, and the bottom insulating liner 151 (FIG. 2).

The substrate 100 may include the first area I and the second area II. The first area I may be an area where an NMOS device is formed, while the second area II may be an area in which the PMOS device is formed.

The first active pattern AP1, the plurality of first gate electrodes 120, the first source/drain pattern 150, and the bottom insulating liner 151 are disposed in the first area I of the substrate 100. The second active pattern AP2, the plurality of second gate electrodes 220, and the second source/drain pattern 250 are disposed in the second area II of the substrate 100.

The second active pattern AP2 may include a second lower pattern BP2 and a plurality of second sheet (e.g., nanosheet) patterns NS2. The second lower pattern BP2 may protrude from the substrate 100. The second lower pattern BP2 may extend in the first direction D1. The plurality of second sheet patterns NS2 may be disposed on the second lower pattern BP2. The plurality of second sheet patterns NS2 may be spaced apart from the second lower pattern BP2 in the third direction D3.

Each of the second lower pattern BP2 and the second sheet patterns NS2 may include one of silicon or germanium as an elemental semiconductor material, a group IV-IV compound semiconductor, or a group III-V compound semiconductor. For example, the second lower pattern BP2 may be made of a semiconductor material. An upper surface BP2 US of the second lower pattern BP2 may be made of a semiconductor material.

In the semiconductor device according to some embodiments, the second lower pattern BP2 may be a silicon lower pattern including silicon, while the second sheet pattern NS2 may be a silicon sheet pattern including silicon (e.g., a silicon nanosheet).

The plurality of second gate structures GS2 may be disposed on the substrate 100. Each of the second gate structures GS2 may extend in the second direction D2. The adjacent second gate structures GS2 may be spaced apart from each other in the first direction D1.

The second gate structure GS2 may be disposed on the second active pattern AP2. The second gate structure GS2 may intersect the second active pattern AP2. The second gate structure GS2 may intersect the second lower pattern BP2. The second gate structure GS2 may surround each of the second sheet patterns NS2.

The second gate structure GS2 may include, for example, a second gate electrode 220, a second gate insulating film 230, a second gate spacer 240, and a second gate capping pattern 245.

The second gate structure GS2 may include a plurality of inner gate structures INT_GS4, INT_GS5, and INT_GS6 disposed between the second sheet patterns NS2 adjacent to each other in the third direction D3 and between the second lower pattern BP2 and the second sheet pattern NS2. The inner gate structures INT_GS4, INT_GS5, and INT_GS6 contact the upper surface BP2 US of the second lower pattern BP2, an upper surface NS2 US of the second sheet pattern NS2, and a bottom surface NS2_BS of the second sheet pattern NS2.

The inner gate structures INT_GS4, INT_GS5, and INT_GS6 may contact (i.e., directly/physically contact) the second source/drain pattern 250.

The second gate structure GS2 may include a fourth inner gate structure INT_GS4, a fifth inner gate structure INT_GS5, and a sixth inner gate structure INT_GS6. The fourth inner gate structure INT_GS4, the fifth inner gate structure INT_GS5, and the sixth inner gate structure INT_GS6 may be sequentially and vertically arranged on the second lower pattern BP2.

The inner gate structures INT_GS4, INT_GS5, and INT_GS6 may include the second gate electrode 220 and the second gate insulating film 230 disposed between the adjacent second sheet patterns NS2 and between the second lower pattern BP2 and the second sheet pattern NS2.

The second gate spacer 240 may be disposed on a sidewall of the second gate electrode 220. The second gate spacer 240 may not be disposed between the second lower pattern BP2 and the second sheet pattern NS2 and between the second sheet patterns NS2 adjacent to each other in the third direction D3.

The second gate insulating film 230 may include a second gate interfacial insulating film 231 and a second gate high dielectric constant insulating film 232. The second gate high dielectric constant insulating film 232 may be disposed between the second gate interfacial insulating film 231 and the second gate electrode 220.

Other descriptions regarding the second gate electrode 220, the second gate insulating film 230, the second gate spacer 240 and the second gate capping pattern 245 are substantially the same as the descriptions about the first gate electrode 120, the first gate insulating film 130, the first gate spacer 140, and the first gate capping pattern 145, and thus are omitted below.

The second source/drain pattern 250 may be formed on the second active pattern AP2. The second source/drain pattern 250 may be formed on the second lower pattern BP2. The second source/drain pattern 250 may be connected to the second sheet pattern NS2.

The second source/drain pattern 250 may be disposed on a side surface of the second gate structure GS2. The second source/drain pattern 250 may be disposed between the second gate structures GS2 adjacent to each other in the first direction D1. For example, the second source/drain pattern 250 may be disposed on each of both opposing sides of the second gate structure GS2. Unlike what is shown, the second source/drain pattern 250 may be disposed on one side of the second gate structure GS2 and may not be disposed on the other side of the second gate structure GS2.

The second source/drain pattern 250 may be included in a source/drain of a transistor using the second sheet pattern NS2 as a channel area thereof.

The second source/drain pattern 250 may be disposed in the second source/drain recess 250R. A bottom portion (e.g., a bottom surface) of the second source/drain recess 250R is in (e.g., is defined by) the second lower pattern BP2. A sidewall of the second source/drain recess 250R may be defined by the second nanosheet NS2 and the inner gate structures INT_GS4, INT_GS5, and INT_GS6.

The sidewall of the second source/drain recess 250R may have a wavy shape. The second source/drain recess 250R may include a plurality of width extension areas 250R_ER. The width extension areas 250R_ER of each of the second source/drain recesses 250R may be defined above the upper surface BP2 US of the second lower pattern BP2.

Unlike what is shown, the sidewall of the second source/drain recess 250R may have a shape similar to that of the first source/drain recess 150R shown in FIG. 12 and FIG. 13.

The second source/drain pattern 250 may contact an entirety of the bottom surface of the second source/drain recess 250R defined by the second lower pattern BP2. The bottom insulating liner 151 (FIG. 2) may not be disposed between the second source/drain pattern 250 and the second lower pattern BP2.

The second source/drain pattern 250 may include an epitaxial pattern. The second source/drain pattern 250 includes a semiconductor material. The second source/drain pattern 250 may include, for example, silicon or germanium as an elemental semiconductor material. Further, the second source/drain pattern 250 may include, for example, a binary compound including two of carbon (C), silicon (Si), germanium (Ge), and tin (Sn), a ternary compound including three thereof, or the binary compound or the ternary compound containing a group IV element doped thereto. For example, the second source/drain pattern 250 may include silicon, silicon-germanium, silicon carbide, etc. The present disclosure, however, is not limited thereto.

The second source/drain pattern 250 may include an impurity-doped semiconductor material. For example, the second source/drain pattern 250 may include a p-type impurity. The p-type impurity may include, but is not limited to, boron (B).

A second source/drain contact 280 is disposed on the second source/drain pattern 250. The second source/drain contact 280 is connected to the second source/drain pattern 250. The second source/drain contact 280 may extend through the interlayer insulating film 190 and the source/drain etch stopper film 185 and may be connected to the second source/drain pattern 250.

A second metal silicide layer 255 may be further disposed between the second source/drain contact 280 and the second source/drain pattern 250.

FIG. 16 to FIG. 24 are diagrams of structures of intermediate steps for illustrating a method for manufacturing a semiconductor device according to some embodiments. For reference, FIG. 16 to FIG. 24 may be a cross-sectional view taken along line A-A of FIG. 1.

Figure 16:
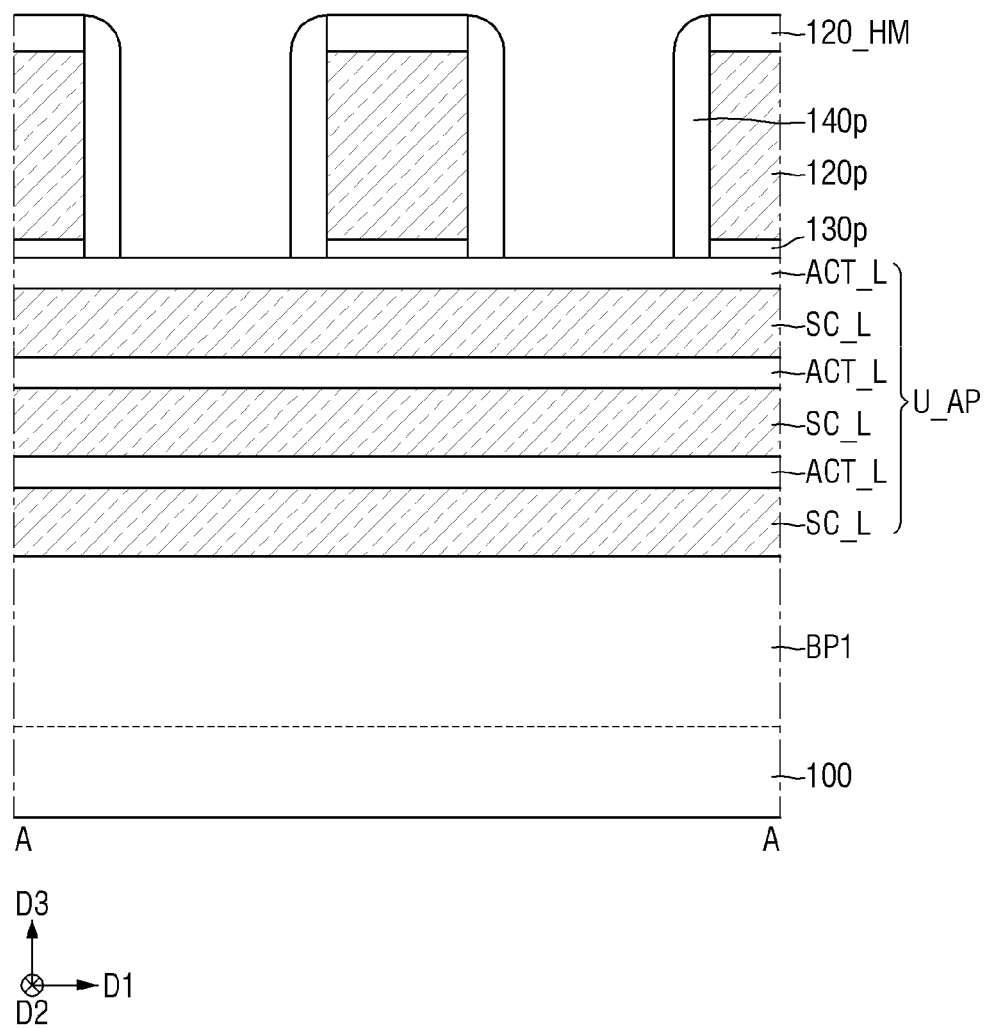
FIG. 16 to FIG. 24 are cross-sectional diagrams of structures of intermediate steps for illustrating a method for manufacturing a semiconductor device according to some embodiments.

Referring to FIG. 16, on the substrate 100, the first lower pattern BP1 and an upper pattern structure U_AP may be formed.

The upper pattern structure U_AP may be disposed on the first lower pattern BP1. The upper pattern structure U_AP may include a plurality of sacrificial patterns SC_L and a plurality of active patterns ACT_L alternately stacked with each other on the first lower pattern BP1.

For example, the sacrificial pattern SC_L may include a silicon-germanium layer. The active pattern ACT_L may include a silicon film.

Subsequently, a dummy gate insulating film 130p, a dummy gate electrode 120p, and a dummy gate capping film 120_HM may be formed on the upper pattern structure U_AP. The dummy gate insulating film 130p may include, for example, silicon oxide. However, the present disclosure is not limited thereto. The dummy gate electrode 120p may include, but is not limited to, polysilicon. The dummy gate capping film 120_HM may include, for example, silicon nitride. However, the present disclosure is not limited thereto.

A pre-gate spacer 140p may be formed on a sidewall of the first dummy gate electrode 120p.

Figure 17:
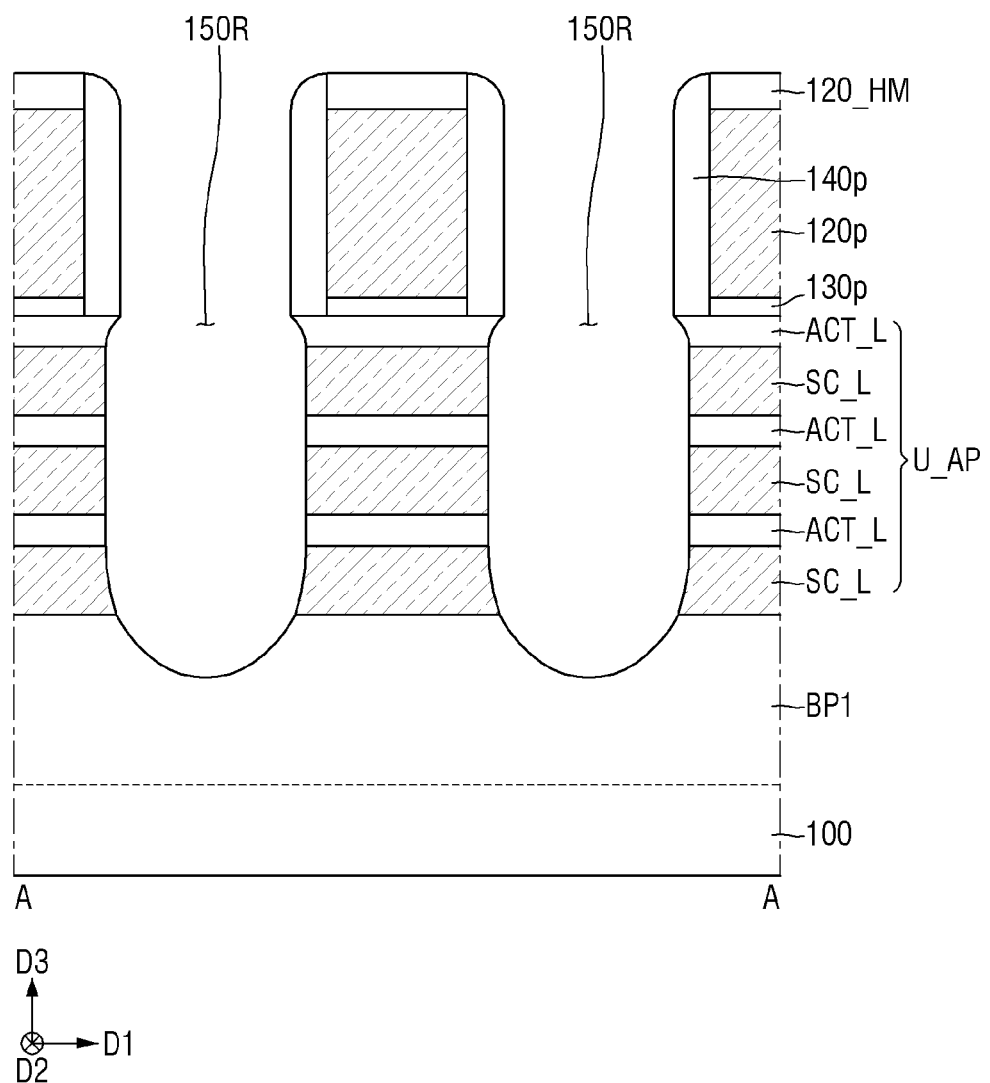
Figure 18:
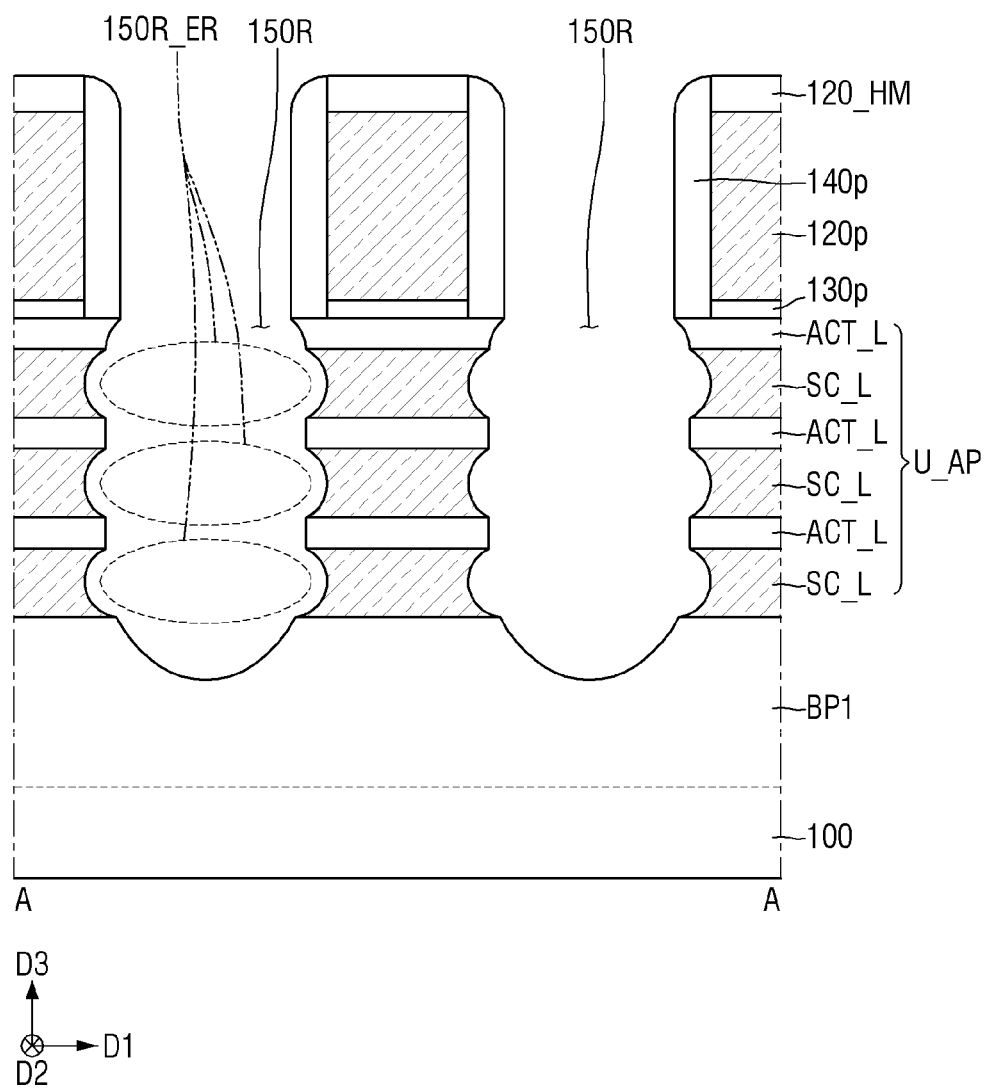

Referring to FIG. 17 and FIG. 18, using the dummy gate electrode 120p as a mask, the first source/drain recess 150R may be formed in the upper pattern structure U_AP.

A portion of the first source/drain recess 150R may be formed in the first lower pattern BP1. The bottom surface of the first source/drain recess 150R may be defined by the first lower pattern BP1.

In FIG. 17, a dimension in the first direction D1 of the first source/drain recess 150R increases and then decreases as the first source/drain recess 150R extends away from the first lower pattern BP1.

In FIG. 18, the first source/drain recess 150R may include the plurality of width extension areas 150R_ER. For example, the first source/drain recess 150R may be formed as shown in FIG. 17, and then the sacrificial patterns SC_L may be additionally etched to form the width extension areas 150R_ER of the first source/drain recess 150R. Accordingly, the sidewall of the first source/drain recess 150R may have a wavy shape. However, a scheme of manufacturing the first source/drain recess 150R including the plurality of width extension areas 150R_ER is not limited to the above scheme.

An example in which subsequent steps of the manufacturing method are performed using the first source/drain recess 150R as shown in FIG. 18 is described.

Figure 19:
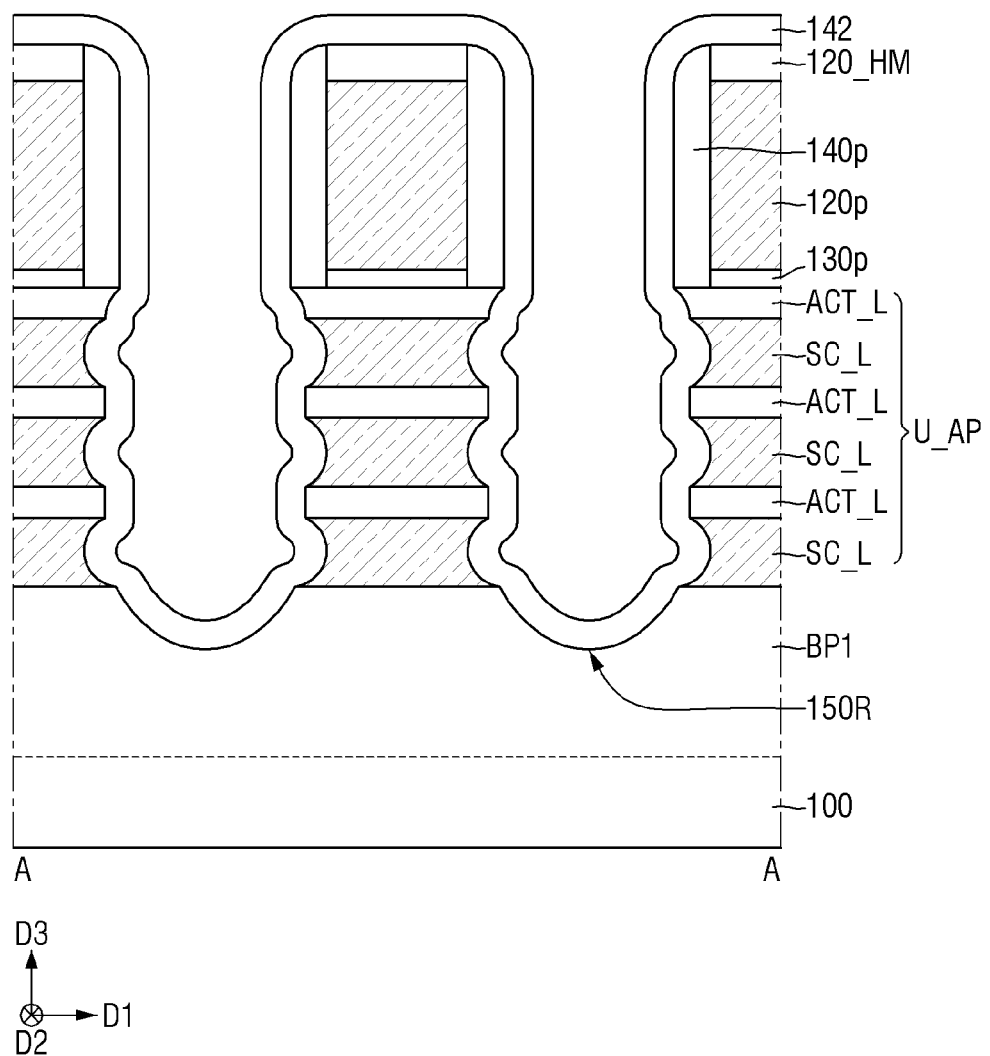

Referring to FIG. 19, a pre-insulating liner 142 may be formed along and on the sidewall of the first source/drain recess 150R and the bottom surface of the first source/drain recess 150R.

The pre-insulating liner 142 may be formed along and on a sidewall of the pre-gate spacer 140p and an upper surface of the dummy gate capping film 120_HM.

Figure 20:
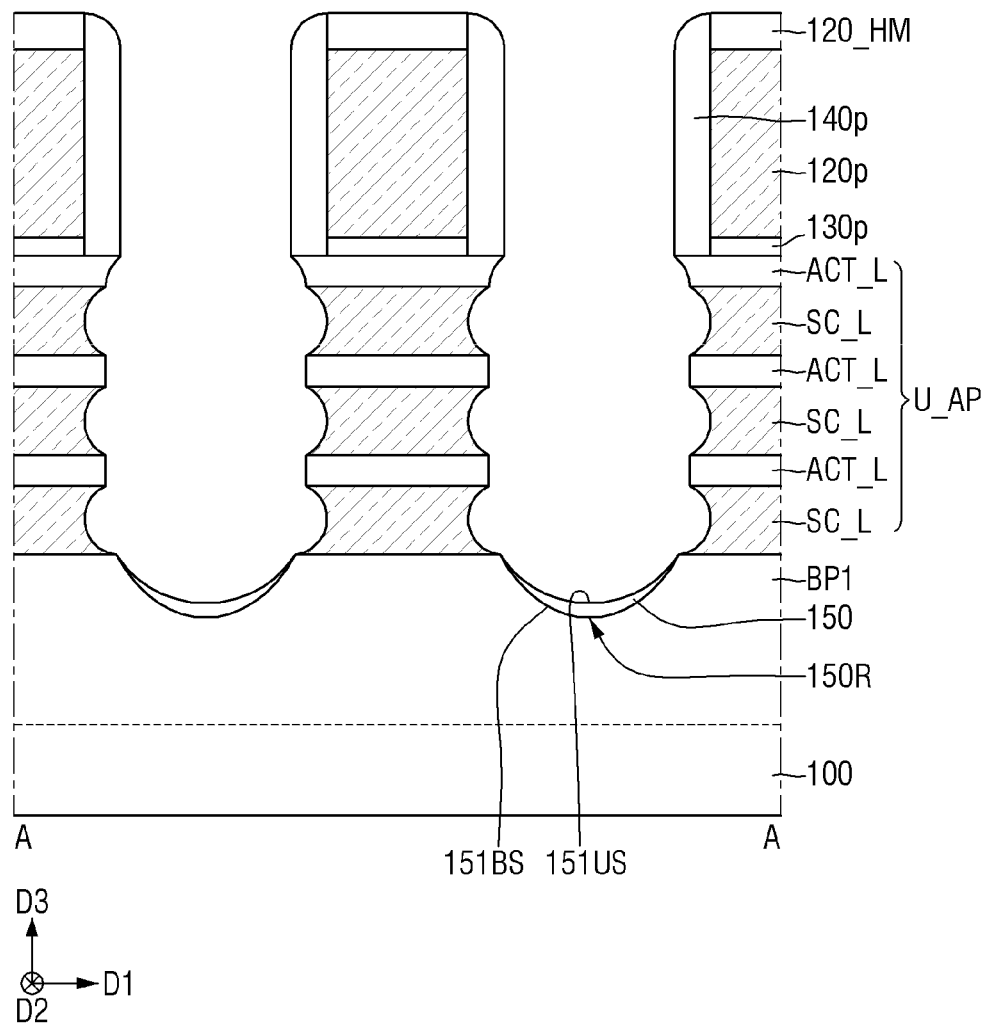
Figure 21:
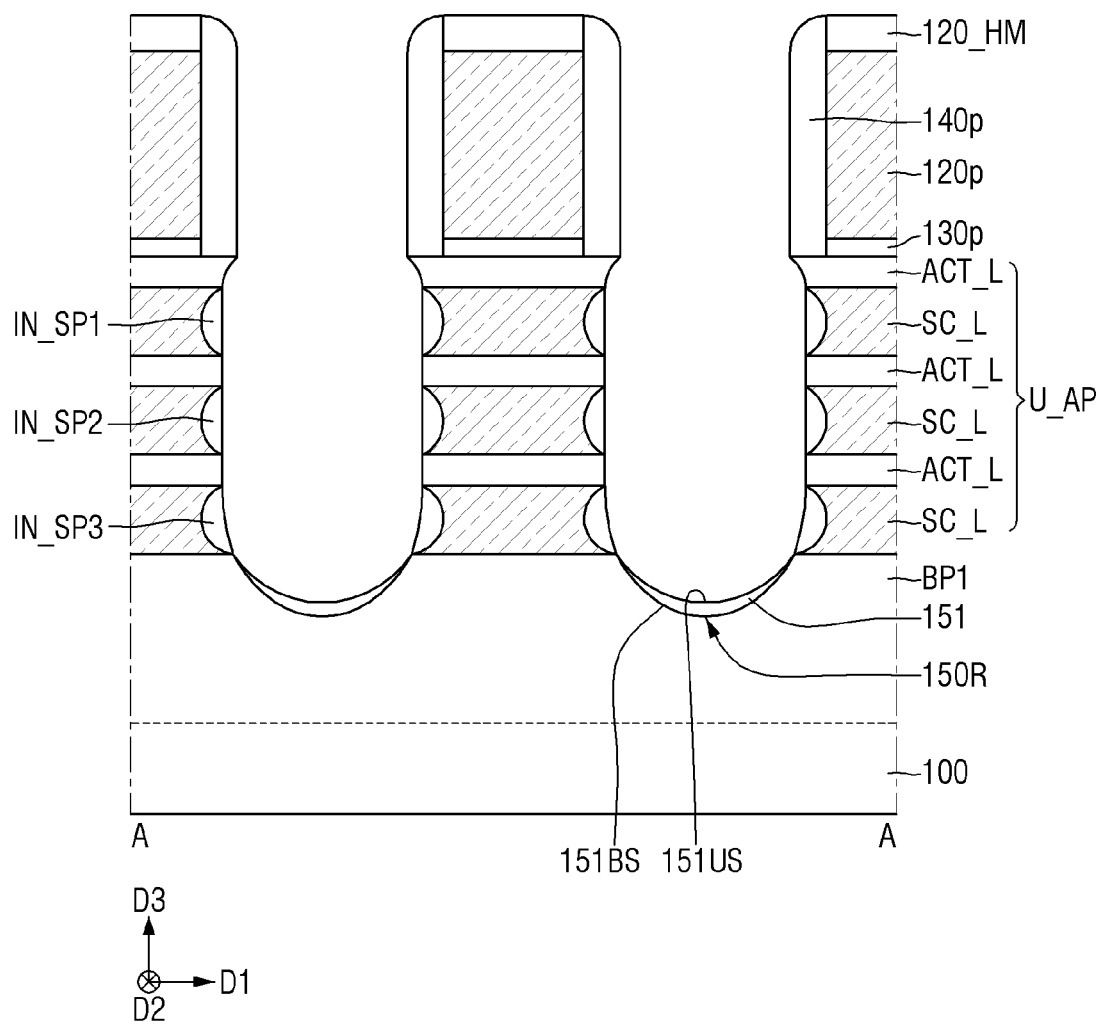

Referring to FIG. 20 and FIG. 21, a portion of the pre-insulating liner 142 may be removed such that the bottom insulating liner 151 (FIG. 2) covering at least a portion of the bottom surface of the first source/drain recess 150R may be formed.

The bottom insulating liner 151 may extend along and on at least a portion of the bottom surface of the first source/drain recess 150R. Each of the bottom surface 151BS of the bottom insulating liner 151 and the upper surface 151US of the bottom insulating liner 151 may be convex downwardly toward the first lower pattern BP1.

In FIG. 20, an inner spacer is not formed between the first lower pattern BP1 and the active pattern ACT_L, and between the adjacent active patterns ACT_L.

In FIG. 21, while (and/or after) the bottom insulating liner 151 is formed, the inner spacers IN_SP1, IN_SP2, and IN_SP3 may be formed. For example, the inner spacers IN_SP1, IN_SP2, and IN_SP3 may be formed from portions of the pre-insulating liner 142. The inner spacers IN_SP1, IN_SP2, and IN_SP3 may be formed between the first lower pattern BP1 and the active pattern ACT_L, and between the adjacent active patterns ACT_L.

An example in which subsequent steps of the manufacturing method are performed based on a structure in which only the bottom insulating liner 151 is formed as shown in FIG. 20 is described. Accordingly, the inner spacers IN_SP1, IN_SP2, and IN_SP3 of FIG. 21 may be omitted in some embodiments.

Figure 22:
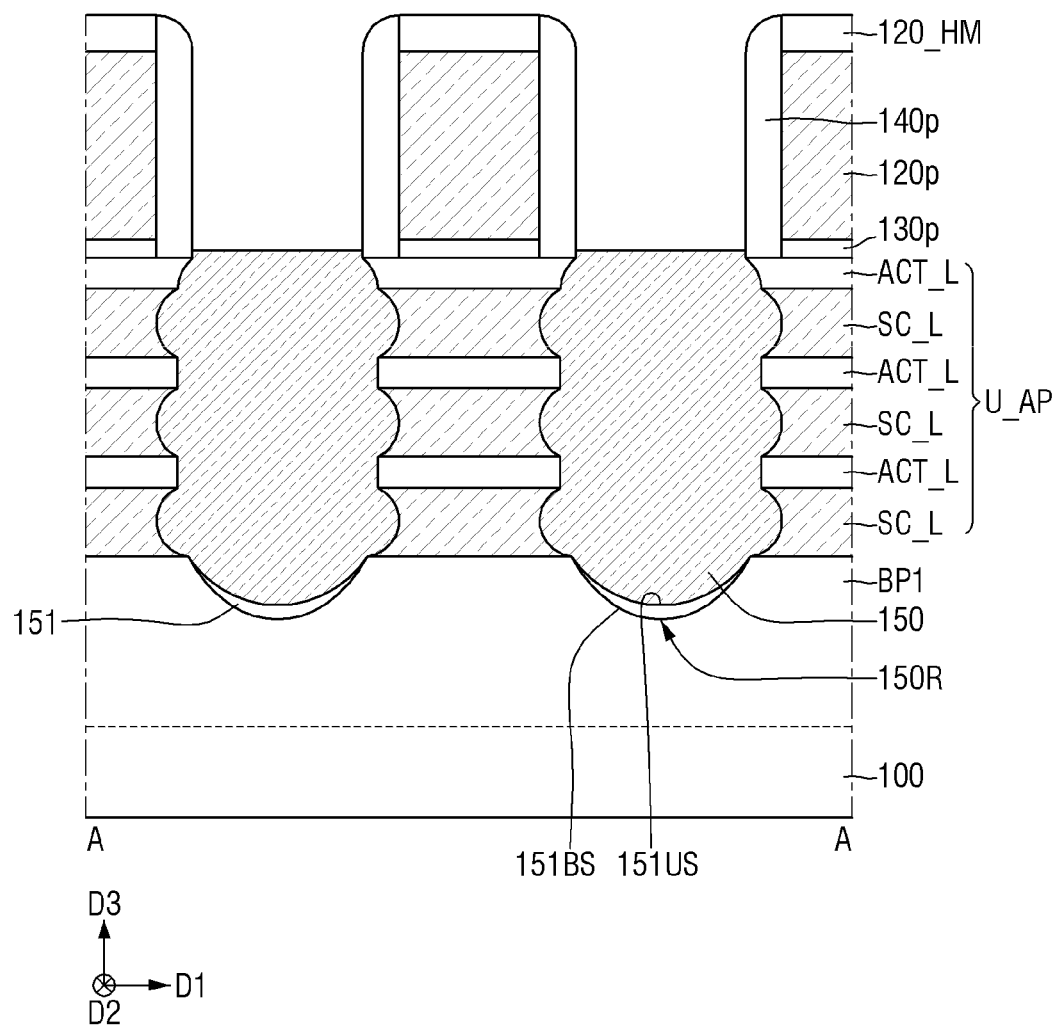

Referring to FIG. 22, the first source/drain pattern 150 is formed on the bottom insulating liner 151.

The first source/drain pattern 150 may be in (e.g., may fill) the first source/drain recess 150R. The first source/drain pattern 150 is connected to the sacrificial pattern SC_L and the active pattern ACT_L.

Figure 23:
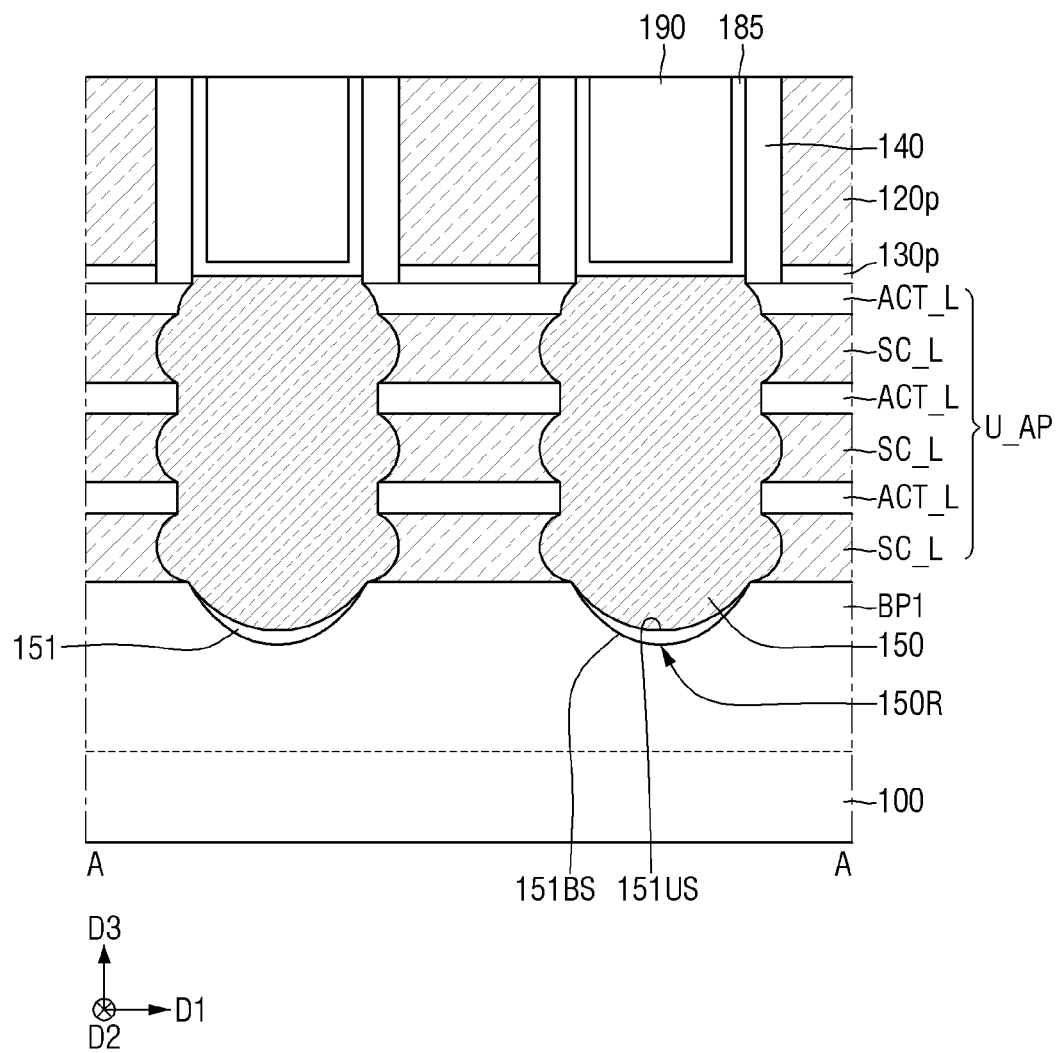

Referring to FIG. 23, the source/drain etch stopper film 185 and the interlayer insulating film 190 are sequentially and vertically formed on the first source/drain pattern 150.

Then, a portion of the interlayer insulating film 190, a portion of the source/drain etch stopper film 185, and the dummy gate capping film 120_HM are removed to expose an upper surface of the dummy gate electrode 120p. While the upper surface of the dummy gate electrode 120p is exposed, the first gate spacer 140 may be formed.

Figure 24:
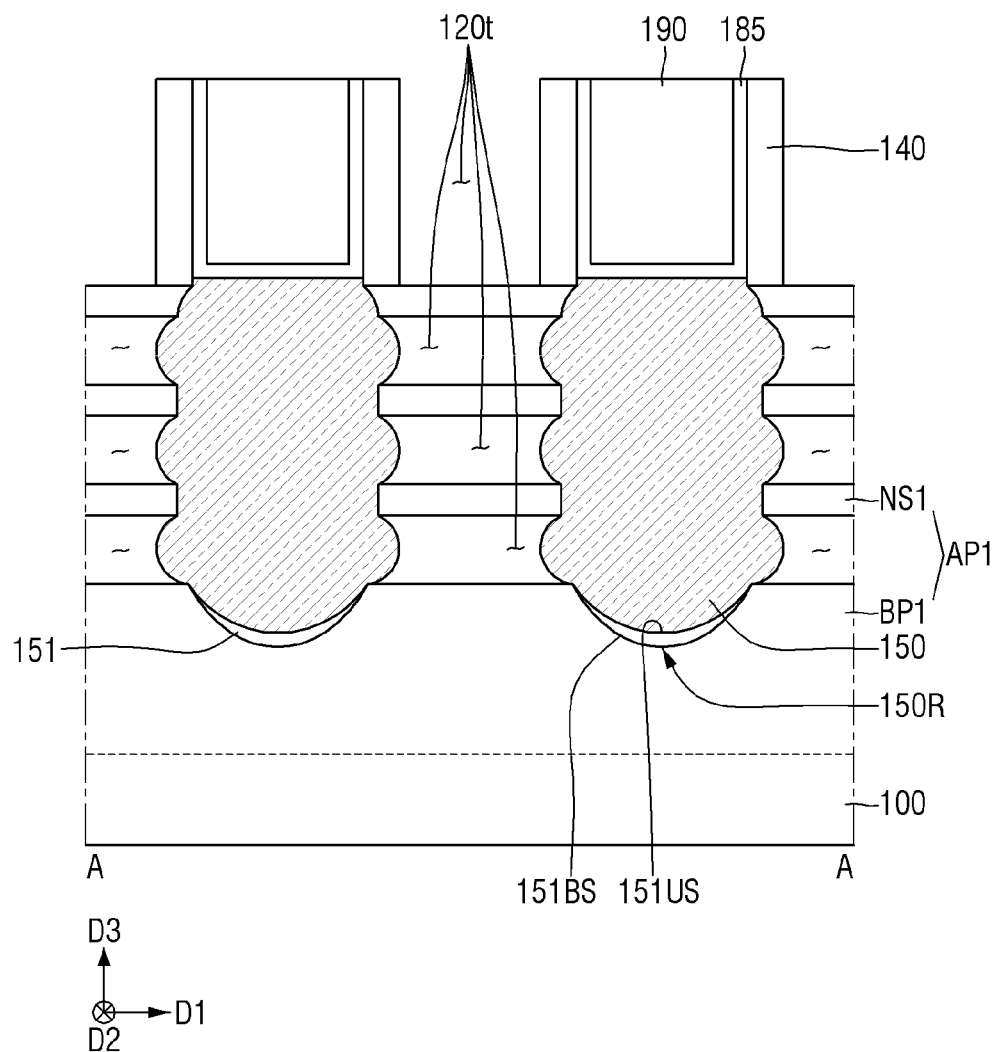

Referring to FIG. 23 and FIG. 24, the dummy gate insulating film 130p and the dummy gate electrode 120p may be removed such that a portion of the upper pattern structure U_AP between the first gate spacers 140 may be exposed.

Subsequently, the sacrificial pattern SC_L may be removed such that the first sheet pattern NS1 may be formed (e.g., provided by the active pattern ACT_L). The first sheet pattern NS1 is connected (e.g., electrically connected) to the first source/drain pattern 150. Accordingly, the first active pattern AP1 including the first lower pattern BP1 and the first sheet pattern NS1 is formed.

Further, the sacrificial pattern SC_L may be removed such that the gate trench 120t is formed between the first gate spacers 140. When the sacrificial pattern SC_L is removed, a portion of the first source/drain pattern 150 may be exposed.

Subsequently, referring to FIG. 2, the first gate insulating film 130 and the first gate electrode 120 may be formed in the gate trench 120t. Further, the first gate capping pattern 145 may be formed.

In concluding the detailed description, those skilled in the art will appreciate that many variations and modifications may be made to the example embodiments without substantially departing from the scope of the present invention.

Therefore, the disclosed example embodiments of the invention are used in a generic and descriptive sense only and not for purposes of limitation.

What is claimed is:

1. A semiconductor device comprising:
  an active pattern including:
    a lower pattern extending in a first direction; and
    a plurality of sheet patterns spaced apart from the lower pattern in a second direction perpendicular to the first direction, wherein the lower pattern comprises a semiconductor material;
  a plurality of gate structures on the lower pattern and spaced apart from each other in the first direction, wherein each of the plurality of gate structures includes a gate electrode and a gate insulating film;
  a source/drain recess between adjacent ones of the gate structures, wherein a bottom of the source/drain recess is in the lower pattern;
  a bottom insulating liner in the bottom of the source/drain recess; and
  a source/drain pattern in the source/drain recess and on top of the bottom insulating liner,
  wherein a vertical distance between a topmost portion of the bottom insulating liner and a bottommost portion of the bottom of the source/drain recess is equal to or smaller than a vertical distance between an upper surface of the lower pattern and the bottommost portion of the bottom of the source/drain recess,
  wherein the gate structures include a first inner gate structure between the lower pattern and a bottommost one of the sheet patterns, and a second inner gate structure between adjacent ones of the sheet patterns,
  wherein the first and second inner gate structures each include the gate electrode and the gate insulating film, and
  wherein the source/drain pattern is in contact with the gate insulating film of the first and second inner gate structures.

2. The semiconductor device of claim 1, wherein a thickness of the bottom insulating liner increases and then decreases as a distance between the bottom insulating liner and a first gate structure of the gate structures increases in the first direction.

3. The semiconductor device of claim 2, wherein an upper surface of the bottom insulating liner has a concave shape and is in contact with a bottom surface of the source/drain pattern.

4. The semiconductor device of claim 1, wherein the bottom insulating liner is not overlapped by any of the sheet patterns in the second direction.

5. The semiconductor device of claim 1,
  wherein the bottom insulating liner includes a first sub-bottom insulating liner and a second sub-bottom insulating liner, and
  wherein the first sub-bottom insulating liner is between the second sub-bottom insulating liner and the lower pattern.

6. The semiconductor device of claim 1, wherein the bottom insulating liner is in contact with an entirety of a recessed surface of the lower pattern.

7. The semiconductor device of claim 1,
  wherein the gate insulating film includes a gate interfacial insulating film and a gate high dielectric constant insulating film on the upper surface of the lower pattern, wherein the gate interfacial insulating film is between the gate high dielectric constant insulating film and the source/drain pattern, and wherein a thickness of the gate interfacial insulating film is smaller than a thickness of the gate high dielectric constant insulating film.

8. A semiconductor device comprising:
an active pattern including:
  a lower pattern extending in a first direction; and
  a plurality of sheet patterns spaced apart from the lower pattern in a second direction perpendicular to the first direction;
a plurality of gate structures on the lower pattern and spaced apart from each other in the first direction, wherein each of the plurality of gate structures includes a gate electrode and a gate insulating film;
a source/drain recess between adjacent ones of the gate structures, wherein a bottom of the source/drain recess is in the lower pattern;
a bottom insulating liner in the bottom of the source/drain recess; and
a source/drain pattern in the source/drain recess and on top of the bottom insulating liner,
wherein a vertical distance between a topmost portion of the bottom insulating liner and a bottommost portion of the bottom of the source/drain recess is equal to or smaller than a vertical distance between an upper surface of the lower pattern and the bottommost portion of the bottom of the source/drain recess,
wherein the bottom insulating liner is not overlapped by any of the sheet patterns in the second direction,
wherein each of the gate structures includes a first inner gate structure between the lower pattern and a bottommost one of the sheet patterns, and a second inner gate structure between adjacent ones of the sheet patterns,
wherein the first and second inner gate structures each include the gate electrode and the gate insulating film, and
wherein the source/drain pattern is in contact with the gate insulating film of the first and second inner gate structures.

9. The semiconductor device of claim 8, wherein a thickness of the bottom insulating liner increases and then decreases as a distance between the bottom insulating liner and a first gate structure of the gate structures increases in the first direction.

10. The semiconductor device of claim 9, wherein an upper surface of the bottom insulating liner has a concave shape.

11. A semiconductor device comprising:
a first active pattern including:
  a first lower pattern extending in a first direction; and
  a plurality of first sheet patterns spaced apart from the first lower pattern in a second direction perpendicular to the first direction;
a second active pattern including:
  a second lower pattern extending in the first direction; and
  a plurality of second sheet patterns spaced apart from the second lower pattern in the second direction;
a plurality of first gate structures on the first lower pattern and spaced apart from each other in the first direction, wherein each of a plurality of the first gate structures includes a first gate electrode and a first gate insulating film;
a plurality of second gate structures on the second lower pattern and spaced apart from each other in the first direction, wherein each of a plurality of the second gate structures includes a second gate electrode and a second gate insulating film;
a first source/drain recess between adjacent ones of the first gate structures, wherein a bottom of the first source/drain recess is in the first lower pattern;
a second source/drain recess between adjacent ones of the second gate structures, wherein a bottom of the second source/drain recess is in the second lower pattern;
a bottom insulating liner in the bottom of the first source/drain recess;
a first source/drain pattern comprising n-type impurities and in the first source/drain recess; and
a second source/drain pattern comprising p-type impurities and in the second source/drain recess, wherein the second source/drain pattern is in contact with the second lower pattern,
wherein a vertical distance between a topmost portion of the bottom insulating liner and a bottommost portion of the bottom of the first source/drain recess is equal to or smaller than a vertical distance between an upper surface of the first lower pattern and the bottommost portion of the bottom of the first source/drain recess,
wherein the first gate structures include a first inner gate structure between the first lower pattern and a bottommost one of the first sheet patterns, and a second inner gate structure between adjacent ones of the first sheet patterns,
wherein each of the first and second inner gate structures includes the first gate electrode and the first gate insulating film,
wherein the first source/drain pattern is in contact with the first gate insulating film of the first and second inner gate structures.

* * * * *